(12) United States Patent
Hosono

(10) Patent No.: US 7,609,558 B2
(45) Date of Patent: Oct. 27, 2009

(54) NON-VOLATILE SEMICONDUCTOR MEMORY DEVICE

(75) Inventor: Koji Hosono, Fujisawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 132 days.

(21) Appl. No.: 11/530,347

(22) Filed: Sep. 8, 2006

(65) Prior Publication Data

US 2007/0058432 A1    Mar. 15, 2007

(30) Foreign Application Priority Data

Sep. 9, 2005    (JP) .............................. 2005-263032

(51) Int. Cl.
*G11C 11/34* (2006.01)
(52) U.S. Cl. ........................... 365/185.23; 365/185.33; 365/185.17
(58) Field of Classification Search ............ 365/185.23, 365/185.17, 185.33, 185.18, 185.02, 185.24
See application file for complete search history.

(56) References Cited

U.S. PATENT DOCUMENTS

| | | | | |
|---|---|---|---|---|
| 6,621,738 B2 * | 9/2003 | Tanaka et al. | ......... | 365/185.18 |
| 6,657,891 B1 | 12/2003 | Shibata et al. | | |
| 6,670,240 B2 * | 12/2003 | Ogura et al. | ................. | 438/257 |
| 6,859,394 B2 | 2/2005 | Matsunaga et al. | | |
| 6,876,578 B2 | 4/2005 | Shibata et al. | | |
| 6,925,004 B2 | 8/2005 | Shibata et al. | | |
| 2005/0210184 A1 * | 9/2005 | Chen et al. | .................. | 711/103 |
| 2005/0213385 A1 * | 9/2005 | Hosono et al. | ......... | 365/185.17 |
| 2007/0279995 A1 * | 12/2007 | Mokhlesi et al. | ....... | 365/185.22 |

* cited by examiner

*Primary Examiner*—Dang T Nguyen
(74) *Attorney, Agent, or Firm*—Oblon, Spivak, McClelland, Maier & Neustadt, P.C.

(57) ABSTRACT

A non-volatile semiconductor memory device includes a memory cell array having a plurality of multi-level memory cells connected in series. The plurality of multi-level memory cells forms a plurality of threshold distributions each of which corresponds to a status of a lower bit and a status of an upper bit, wherein a lower bit and an upper bit constitute a lower page and an upper page respectively. The status of the lower bit dichotomizes the threshold distributions into two groups and the status of the upper bit further dichotomizes each of two groups. When programming a memory cell of the upper page, higher potentials are applied to a non-selected word line adjacent to the selected word line than those applied to the non-selected word line when programming the memory cell of the lower page.

20 Claims, 24 Drawing Sheets

FIG.18

|  | Lower Page | Upper Page |
|---|---|---|
| SGD | Vdd | Vdd |
| WL31 | Vm | Vm |
|  |  |  |
| WLn+2 | Vm | Vm |
| WLn+1 | Vm | Vm |
| WLn(selected) | Vpgm | Vpgm |
| WLn-1 | Vm | V1 |
| WLn-2 | Vm | V2 |
| WLn-3 | Vm | Vm |
| WLn-4 | Vm | Vm |
|  |  |  |
| WL0 | Vm | Vm |
| SGS | 0 | 0 |

FIG.19

|  | Lower Page | Upper Page |
|---|---|---|
| SGD | Vdd | Vdd |
| WL31 | Vm | Vm |
|  |  |  |
| WLn+2 | Vm | Vm |
| WLn+1 | Vm | Vm |
| WLn(selected) | Vpgm | Vpgm |
| WLn-1 | V1 | Vm |
| WLn-2 | V2 | Vm |
| WLn-3 | Vm | Vm |
| WLn-4 | Vm | Vm |
|  |  |  |
| WL0 | Vm | Vm |
| SGS | 0 | 0 |

FIG.21

|  | Lower Page | Upper Page |
|---|---|---|
| SGD | Vdd | Vdd |
| WL31 | Vm | Vm |
|  |  |  |
| WLn+2 | Vm | Vm |
| WLn+1 | V3 | V4 |
| WLn(selected) | Vpgm | Vpgm |
| WLn-1 | V1 | V1 |
| WLn-2 | V2 | V2 |
| WLn-3 | Vm | Vm |
| WLn-4 | Vm | Vm |
|  |  |  |
| WL0 | Vm | Vm |
| SGS | 0 | 0 |

FIG.24

|         | Lower Page | Upper Page |
|---------|------------|------------|
| SGD     | Vdd        | Vdd        |
| WL31    | Vm         | Vm         |
|         |            |            |
| WLn+2   | Vm         | Vm         |
| WLn+1   | V3         | V4         |
| WLn(selected) | Vpgm | Vpgm       |
| WLn-1   | V5         | V6         |
| WLn-2   | V1         | V1         |
| WLn-3   | V2         | V2         |
| WLn-4   | Vm         | Vm         |
|         |            |            |
| WL0     | Vm         | Vm         |
| SGS     | 0          | 0          |

NON-VOLATILE SEMICONDUCTOR MEMORY DEVICE

CROSS-REFERENCE TO RELATED APPLICATIONS

This application is based upon and claims the benefit of priority from the prior Japanese Patent Applications No. 2005-263032, filed on Sep. 9, 2005, the entire contents of which are incorporated herein by reference.

TECHNICAL FIELD

The present invention relates to an electrically programmable non-volatile semiconductor memory device and the driving method thereof, and more particularly in the non-volatile semiconductor memory device, to a driving method at the time of data programming of a NAND type flash memory device.

BACKGROUND OF THE INVENTION

In recent years, demand for non-volatile semiconductor memory devices which are compact and have large capacity has been increasing rapidly. A NAND type flash memory device, in which higher integration and larger capacity are expected as compared with a conventional NOR type flash memory device, has attracted attention.

FIG. 1 shows an example of a relationship between threshold voltage (Vt) distributions in a multi-level NAND type flash memory device which stores 2-bit data in one memory cell by a multi-level cell (MLC) method. In this particular example, the 2- bit data stored to one memory cell are allocated as data of a different page. In other words, in a NAND type flash memory device, reading-out data and programming operation are performed on every page unit such as 2 Kbytes or 512 bytes; in the case of performing such a multi-level storing, data corresponding to two row addresses are stored to one memory cell. They are hereinafter called "upper page" and "lower page" respectively.

In the example shown in FIG. 1, initially, a status of a memory cell is an erased cell "11". Then, data are programmed into a lower page of the memory cell. In doing so, in the case of programming "0" data into the lower page, programming is performed, shifting the threshold voltage (Vt) of the memory cell from "11" distribution to "10" distribution (refer to the upper section of FIG. 1). In addition, in the case of programming "1" data into the lower page, the threshold voltage (Vt) of the memory cell is not shifted (not shown in the figures).

Next, data is programmed into the upper page of the memory cell. In the case of programming "0" data into the upper page and storing "1" data to the lower page, programming is performed shifting the threshold voltage (Vt) of the memory cell from "11" distribution to "01" distribution (refer to the lower section of FIG. 1). Also, in the case of programming "0" data to the upper page and storing "0" data on the lower page, programming is performed shifting the threshold voltage (Vt) of the memory cell from "10" distribution to "00" distribution (refer to the lower section of FIG. 1).

In this example, reading-out data of the lower page is performed by performing A read-out after C read-out so as to output data of C read-out and A read-out (refer to upper section of FIG. 1), and reading-out of data of the upper page is performed by performing B read-out so as to output data of B read-out (refer to lower section of FIG. 1).

BRIEF SUMMARY OF THE INVENTION

A non-volatile semiconductor memory device according to one embodiment of the present invention comprises:
 a memory cell array having a plurality of electrically-programmable memory cells, said memory cell storing 2 bits, a lower bit and an upper bit are addressed by a lower page and an upper page respectively, having;
  a plurality of memory cell units, wherein said plurality of said memory cells are connected in series;
  a plurality of word lines each connected to each of control gates of said plurality of said memory cells, said plurality of word lines including a selected word line connected to a control gate of said memory cell to be programmed, and a plurality of non-selected word lines except for said selected word line;
  a plurality of bit lines each connected to one end of said plurality of said memory cell units; and
  a source line connected to another end of said memory cell unit,
 wherein potentials applied to said non-selected word lines adjacent to said selected word line at time of programming said selected memory cell of said upper page are different from potentials applied to said non-selected word lines adjacent to said selected word line at time of programming said selected memory cell of said lower page.

A non-volatile semiconductor memory device according to one embodiment of the present invention comprises:
 a memory cell array having a plurality of electrically-programmable memory cells, said memory cell storing 2 bits, a lower bit and an upper bit are addressed by a lower page and an upper page respectively, having;
  a plurality of memory cell units, wherein said plurality of said memory cells are connected in series, having five threshold voltage distributions having:
   a first distribution in an erased state having a lowest threshold voltage distribution; and
   a second to a fifth distribution having higher threshold voltage distributions in sequence;
  a plurality of word lines each connected to each of control gates of said plurality of said memory cells, said plurality of word lines including a selected word line connected to a control gate of said memory cell to be programmed, and a plurality of non-selected word lines except for said selected word line;
  a plurality of bit lines each connected to one end of said plurality of said memory cell units; and
  a source line connected to another end of said memory cell units,
 wherein when data are programmed into said lower page of said selected memory cell, a first potential is applied to said non-selected word line, afterwards a second potential (said first potential<said second potential) is applied to said selected word line, so as to shift a threshold voltage of said selected memory cell from said first distribution toward said third distribution that is posited almost in the center between said first distribution and said fifth distribution or made to remain in said first distribution;
 wherein when data is further programmed into said upper page of said selected memory cell, a fourth potential is applied to said second non-selected word line adjacent to said source line side of said first non-selected word line and said first potential is applied to said non-selected word lines except for said first non-selected word line and said second non-selected word line at the same time when a third potential is applied to said first non-selected word line adjacent to said source line side of said selected word line; and then said second potential is applied to said selected word line so as to shift said threshold voltage of said selected memory cell from said first distribution toward said second distribution, to shift said threshold voltage of said selected memory from said third distribution toward said fourth distribution, to shift said threshold voltage of said selected memory from said third distribution toward said fifth distribution, or made to remain in said first distribution.

BRIEF DESCRIPTION OF THE DRAWINGS

The accompanying drawings, which are incorporated in and constitute a part of this specification, illustrate an implementation of the present invention, and together with the description, explain the invention.

FIG. 18 is a table showing applied voltages at the time of the lower page programming and applied voltages at the time of upper page programming in the NAND type flash memory device 1 according to one embodiment of the non-volatile semiconductor memory device of the present invention.

FIG. 19 is a table showing applied voltages at the time of the lower page programming and applied voltages at the time of upper page programming in the NAND type flash memory device 1 according to one embodiment of the non-volatile semiconductor memory device of the present invention.

FIG. 21 is a table showing applied voltages at the time of the lower page programming and applied voltages at the time of upper page programming in the NAND type flash memory device 1 according to another embodiment of the non-volatile semiconductor memory device of the present invention.

FIG. 24 is a table showing applied voltages at the time of lower page programming and applied voltages at the time of upper page programming in the NAND type flash memory device 1 according to another embodiment of the non-volatile semiconductor memory device of the present invention.

DETAILED DESCRIPTION OF THE INVENTION

Figure 2:
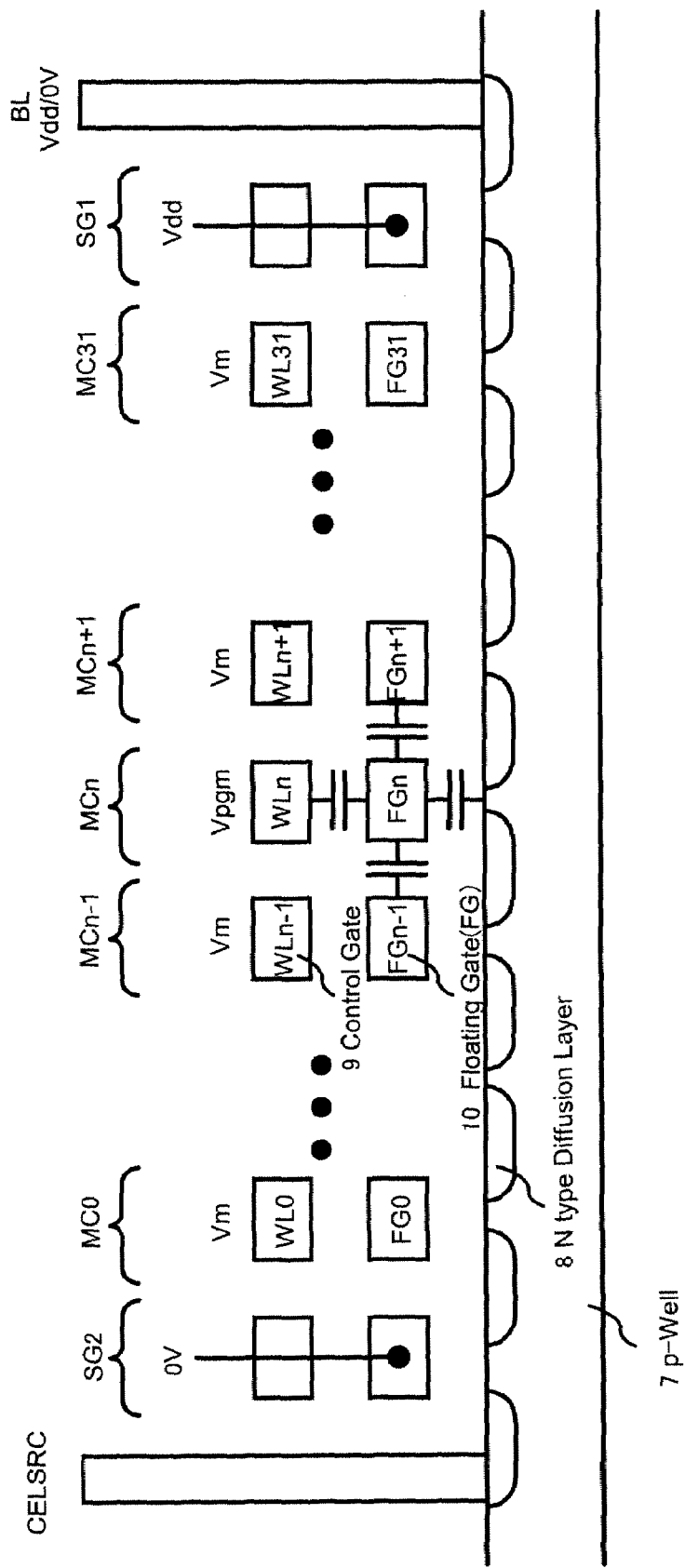
FIG. 2 is a sectional view showing an exemplary configuration of a memory cell part of the NAND type flash memory device.

An exemplary configuration of a memory cell part of a NAND type flash memory device is shown in a sectional view of FIG. 2. A base unit of a memory cell part of the NAND type flash memory device is, for example, as shown in FIG. 2, configured to a plurality of memory cells MC0-MC31 connected in series and two Selection Transistors SG1 and SG2. The Selection Transistor SG1 is connected to a Bit Line BL, and the Selection Transistor SG2 is connected to a source line CELSRC which is common in the memory cell array. One memory cell has a control gate 9 and an electric charge accumulation layer (here, being referred to as a Floating Gate (FG) 10), in which N type diffusion layers 8 formed on a p-well 7 is set as a source/drain, and which are connected to the Word Line WL. By changing the amount of charge held in the Floating Gate (FG) 10 with a programming operation and/or an erase operation, threshold voltage (Vt) of the memory cell is changed, and thus data of 1 bit or data of 2 bits are stored.

Referring to FIG. 2, an example of a voltage applied state in the process of programming is explained. Programming voltage Vpgm is applied to the selected Word Line WLn, and programming pass voltage Vm is applied to the other Word Line except for the WLn (the non-selected Word Line WL0–WLn−1 and WLn+1–WL31). The programming voltage Vpgm is, for example, around 20 V, and the programming pass voltage Vm is, for example, around 10V. Bit line BL side Selection Transistor SG1 has a normal transistor structure having no floating gate (FG) 10, of which a voltage of less than or equal to power supply voltage Vdd is being applied. A Selection Transistor SG2 of a source line side also has the same structure as that of SG1, to which 0V is applied. In the case of "0" data programming, 0V is applied to bit line BL; in the case of one "1" data programming, the power supply voltage Vdd is applied. In the case of "0" data programming, 0V applied to the bit line BL is transferred to a channel of the selected memory MCn, and the potential difference of around 20V is applied between the selected Word Line WLn and the channel. Electrons are injected into a floating gate (FGn) 10 by Fowler-Nordheim (FN) tunneling current, and thus the threshold voltage (Vt) shifts to positive. On the other hand, in the case of "1" data programming, the selection gate transistor SG1 transfers the voltage which drops threshold voltage (Vt) from the power supply voltage Vdd, i.e., Vdd−Vt, while it becomes a cut-off state. Thus, the channel potential is boosted while the Vm and the Vpgm are applied to Word Line WL. Therefore, it may be in a state that the FN tunneling current is not flowed so that the threshold voltage (Vt) may not be shifted.

The NAND type flash memory device has been highly integrated than other flash memories due to its simple memory cell structure. However, a coupling noise among floating gates (FG), in which threshold voltage (Vt) of a memory cell once programmed is shifted by programming of adjacent cells, can not be ignored any longer. In particular, in the case of performing a multi-level memory, there exists larger difference of the threshold voltage between the lowest state and the highest state. It may cause larger coupling noise among memory cells. Therefore, it is problematic to reduce the physical coupling noises between the memory cells.

Figure 1:
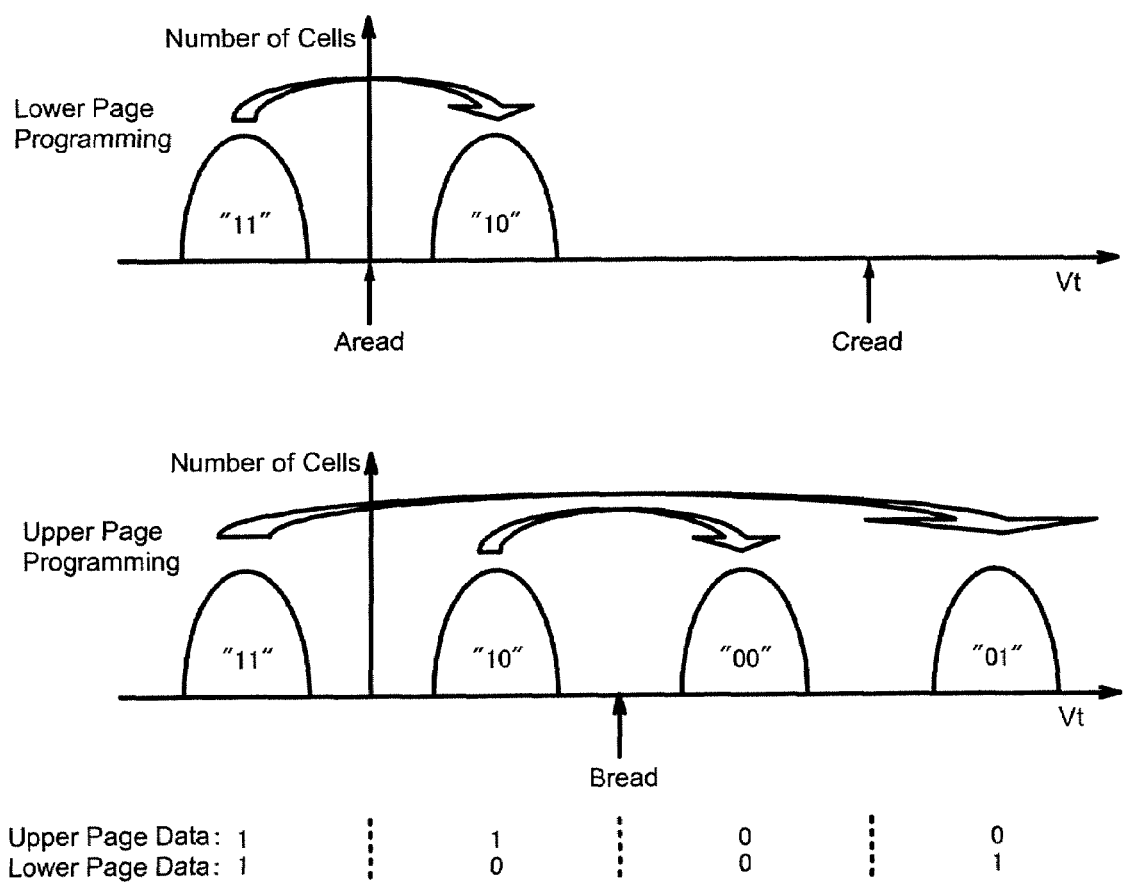
FIG. 1 is a diagram showing an exemplary relationship between threshold voltage (Vt) distribution of the memory cells and data in a multi-level NAND type flash memory device with an MLC method.

For example, an exemplary relationship between threshold voltage (Vt) distribution of the memory cells and data in the multi-level NAND type flash memory device of a conventional MLC method is shown in FIG. 1. There is a case, in which threshold voltage (Vt) of memory cells must be shifted with a full swing from "11" distribution to "01" distribution at the time of upper page programming. Thus coupling noises among floating gates (FG) increase.

Next by using FIG. 3 and FIG. 4, coupling noise generation among the floating gates (FG) in the case of the above-described NAND type flash memory device will be explained in detail. In addition, FIG. 3 is an example when cell n_e is focused attention to, and FIG. 4 is an example when cell n_o is focused attention to.

Figure 3:
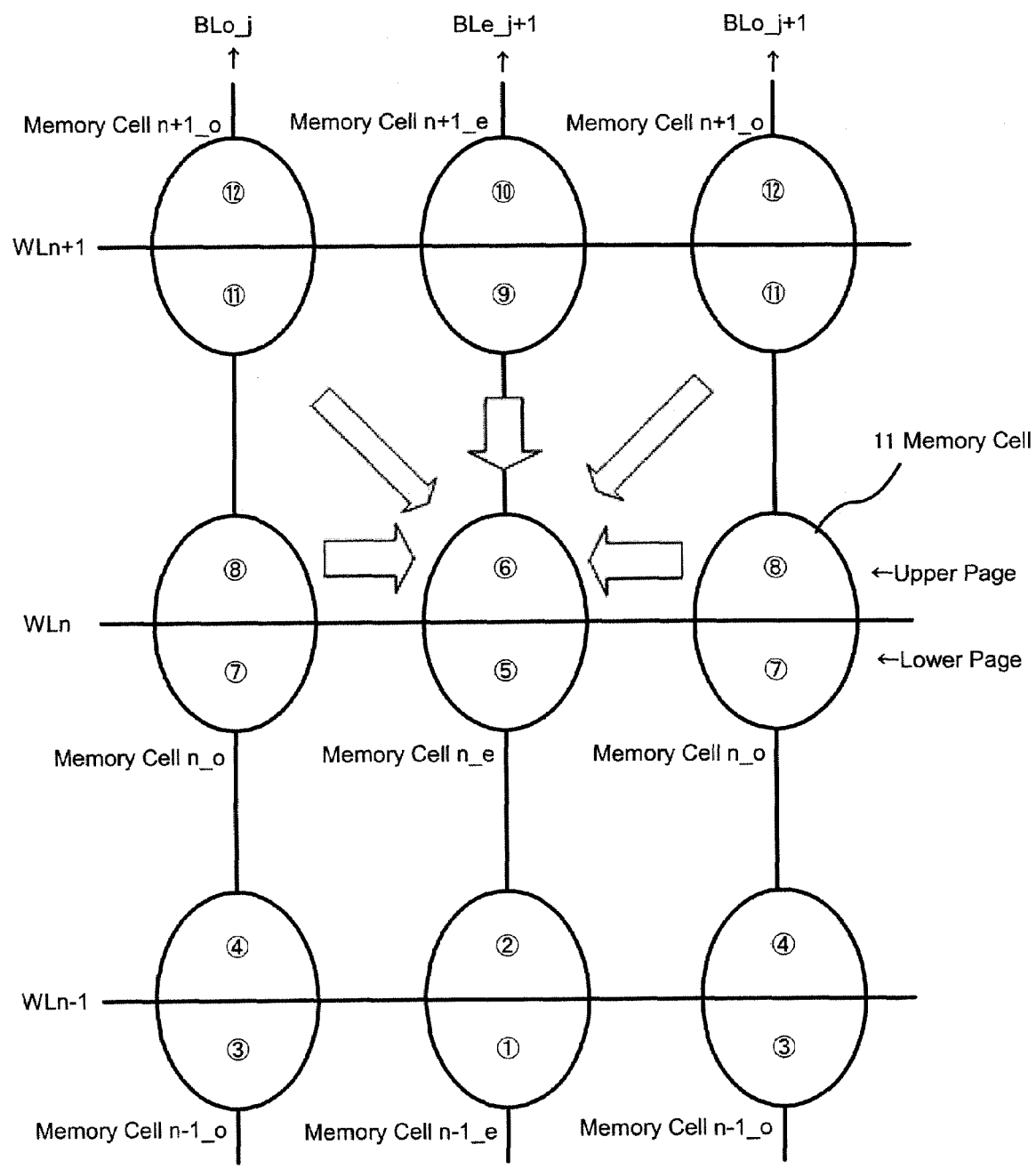
FIG. 3 is a diagram showing an example of coupling noise generation among floating gates (FG) in the multi-level NAND type flash memory device with an MLC method.

In FIG. 3, the nine ovals represent memory cells 11, the top halves of which represent upper pages of the memory cells 11 and the bottom halves of which represent lower pages of the memory cells 11. In addition, the numbers of the ovals show a programming order of data. The vertical lines in FIG. 3 are connected to bit lines BL ( . . . , BLo_j, BLe_j+1, BLo_j+1, . . . ). Further in FIG. 3, the bit line BLe_j+1 is an even number bit line BL counting from zero, and bit line BLo_j and BLo_j+1 are odd number bit lines BL counting from zero, respectively. Further in FIG. 3, the horizontal lines represent Word Lines WL ( . . . , WLn−1, WLn, WLn+1, . . . ).

A data programming operation of the NAND type flash memory device is performed mainly from the memory cells 11 that are in the furthest positions from the bit lines BL. In the example shown in FIG. 3, data programming is performed in order of the numbers in the whole ovals, such as: firstly, the lower page of n−1_e; next, the upper page of cell n−1_e; next, the lower page of cell n−1_o ; next, the upper page of cell n−1_o; next the lower page of cell n_e; . . . etc. Here, focusing attention on a cell n_e in the center part of FIG. 3, after programming of cell n_e, there may be a case that the data programming is performed, in which the threshold voltage (Vt) of the memory cell shown in the above-described FIG. 1 is shifted from the "11" distribution to the "01" distribution with a full swing, at the time of upper page programming of the adjacent cell n_o, cell n+1_e, and cell n+1_o. As a consequence, the coupling noises among the floating gates (FG) will become extremely large.

Figure 4:
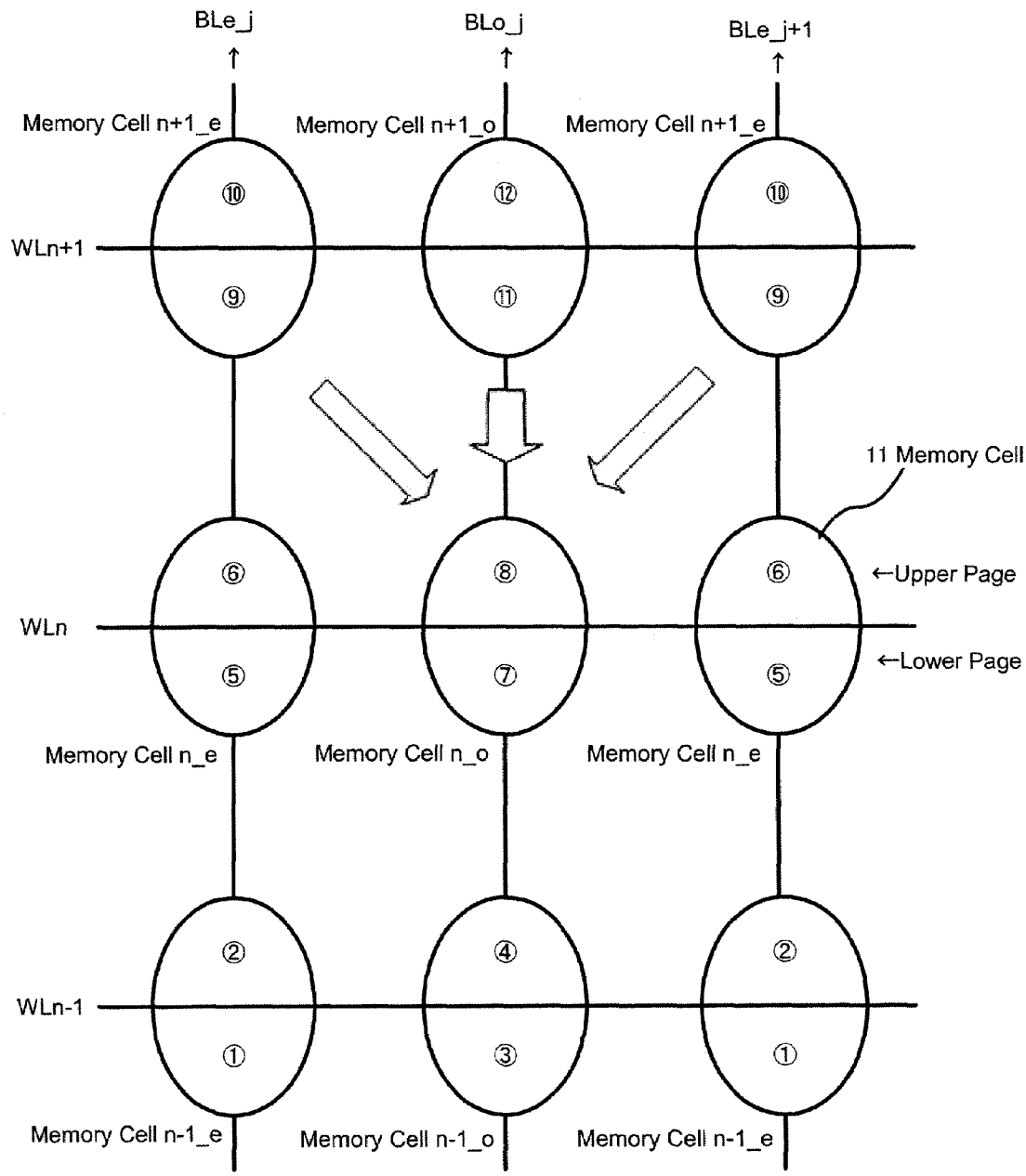
FIG. 4 is a diagram showing another example of the coupling noise generation among the floating gates (FG) in the multi-level NAND type flash memory device of an MLC method.

Next in FIG. 4, nine ovals represent memory cells 11 the top halves of which represent upper pages of the memory cells 11 and the bottom half of which represent lower pages of the memory cells 11. In addition, numbers of the ovals show a programming order of data. And the vertical lines in FIG. 4 are connected to bit lines BL ( . . . , BLe_j, BLo_j, BLe_j+1, . . . ). Further in FIG. 4, the bit line BLe_j and BLe_j+1 are even number bit lines counting from zero, respectively, and bit line BLo_j is an odd number bit line BL counting from zero. Further in FIG. 4, the horizontal lines represent Word Lines WL ( . . . , WLn−1, WLn, WLn+1, . . . ).

Also in an example shown in FIG. 4, the data programming is performed in order of the numbers of the ovals such as: firstly, the lower page of n−1_e; next, the upper page of cell n−1_e; next, the lower page of cell n−1 _o; next, the upper page of cell n−1_o; next, the lower page of cell n_e, . . . etc. Here, focusing attention on a cell n_o in the center part of FIG. 4, after programming of cell n_o, there may be a case that the data programming is performed, in which the threshold voltage (Vt) of the memory cell shown in the above-described FIG. 1 is shifted from the "11" distribution to the "01" distribution with a full swing, at the time of upper page programming of the adjacent cell n+1_o, and cells n+1_e. As a consequence, the coupling noises among the floating gates (FG) will be still large.

In addition, taking the coupling noise generation among the floating gates (FG) of the adjacent memory cells into consideration, an improved multi-level NAND type flash memory device has been proposed, in which programming is performed into the lower page of the adjacent memory cells after having performed programming to the lower page of a certain memory cell and before performing programming to the upper page of the memory cells (U.S. Pat. No. 6,657,891). However, in the multi-level NAND type flash memory device disclosed in the above-mentioned United States patent, when programming is performed to an upper page of a certain memory cell, programming must be performed into lower pages of the memory cells which are adjacent to the certain memory cell in advance.

In a programming operation of the above-described multi-level NAND type flash memory device of the conventional MLC method, after programming of a certain memory cell and at the time of programming of the upper page of the adjacent memory cells, there may be a case that data programming is performed and shifted the threshold voltage (Vt) of the memory cell from "11" distribution to "01" distribution with a full swing, which consequently caused the coupling noises among the floating gates (FG) to increase.

In the present invention, a non-volatile semiconductor memory device such as a NAND type flash memory device with high reliability and a driving method thereof are provided, in which coupling noises among floating gates (FG) and generation of erratic programming are suppressed without requiring a big change of design of the element structures of the conventional NAND type flash memories.

Embodiments of the non-volatile semiconductor memory device of the present invention are explained as follows.

Figure 5:
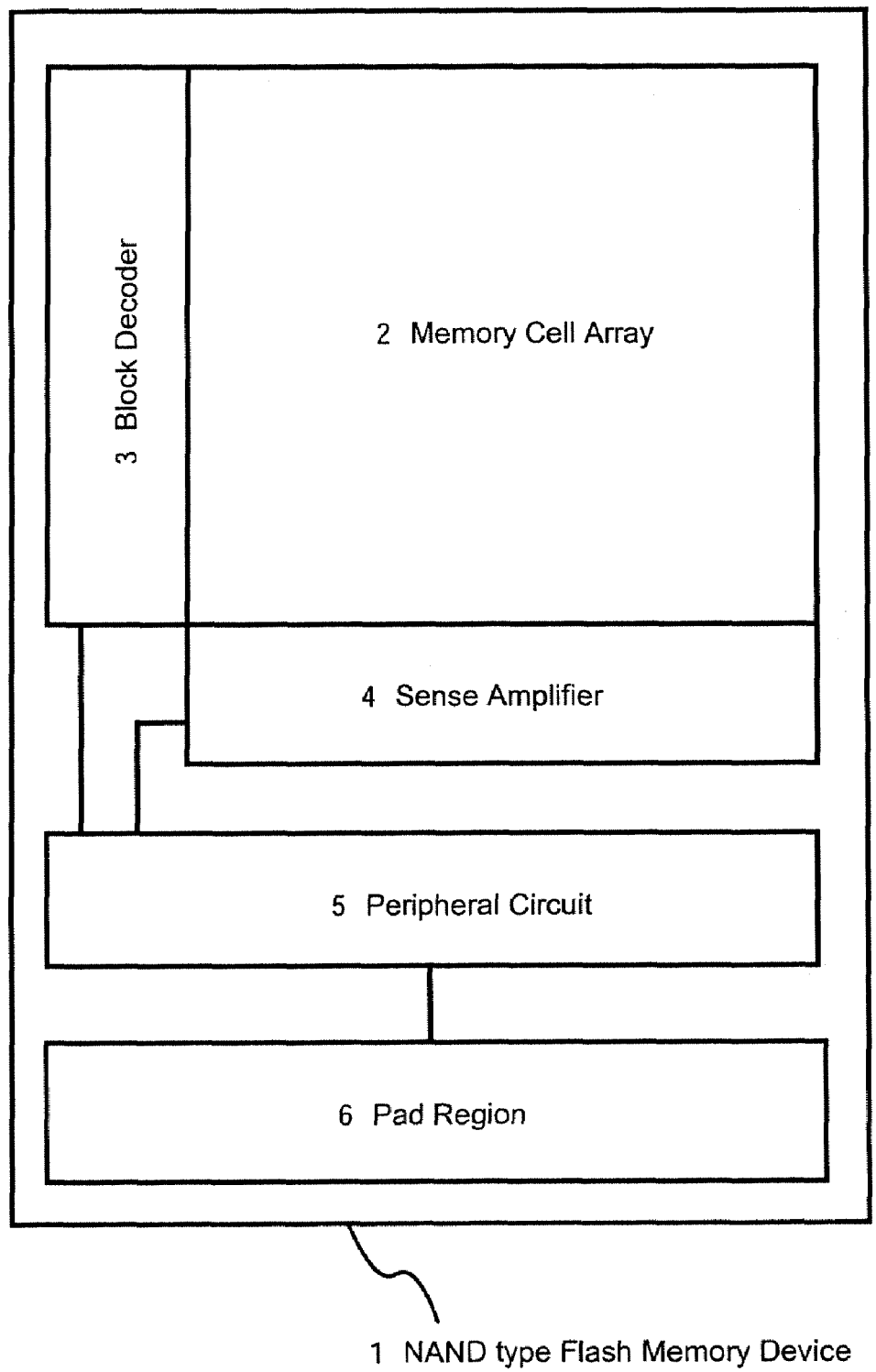
FIG. 5 is a schematic block diagram of the NAND type flash memory device 1 according to one embodiment of the non-volatile semiconductor memory device of the present invention.

A schematic block diagram of the NAND type flash memory device 1 according to one embodiment of the non-volatile semiconductor memory device of the present invention is shown in FIG. 5. The NAND type flash memory device 1 shown in FIG. 5 includes a memory cell array 2, in which a plurality of electrically programmable memory cells are arranged in the shape of a matrix; a block decoder 3; a sense amplifier 4; a peripheral circuit 5; and a pad region 6.

Figure 6:
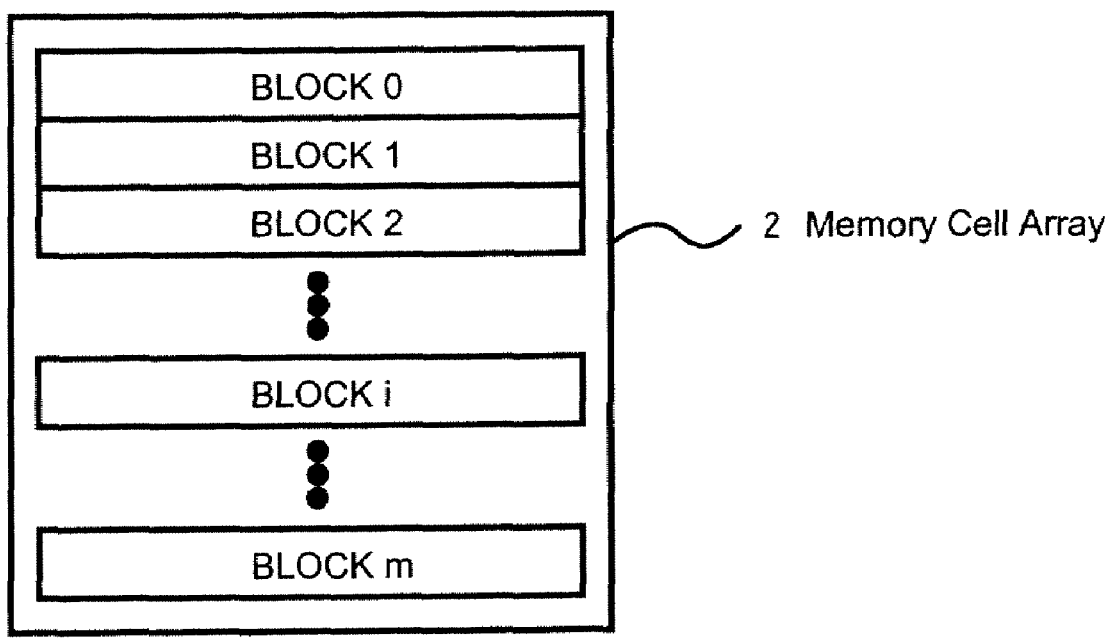
FIG. 6 is a diagram showing a configuration of a memory cell array 2 of the NAND type flash memory device 1 according to one embodiment of the non-volatile semiconductor memory device of the present invention.

Here, an example of configuration of the memory cell array 2 is shown in FIG. 6. As shown in FIG. 6, the memory cell array 2 is divided into m blocks (BLOCK0, BLOCK1, . . . , BLOCKi, . . . , BLOCKm) in total. Hereby "a block" represents a minimum unit of data elimination.

Figure 7:
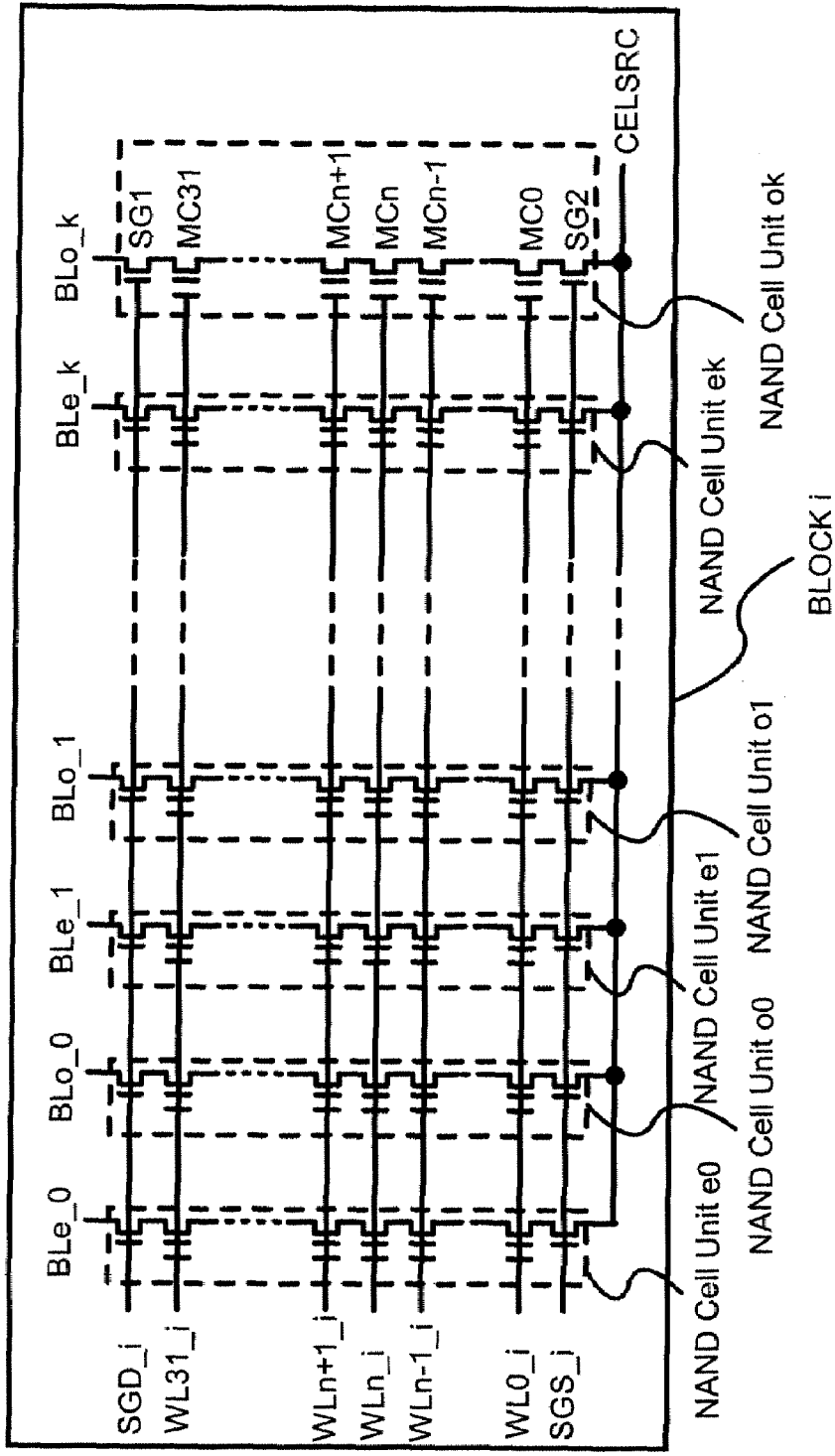
FIG. 7 is a diagram showing the configuration of memory blocks BLOCKi of the NAND type flash memory device 1 according to one embodiment of a non-volatile semiconductor memory device of the present invention.

In addition, each block BLOCK0-BLOCKm are configured to 2*k NAND cell units e0 to ok respectively, such as a block BLOCKi shown representatively in FIG. 7. In this embodiment, each NAND cell unit is configured 32 memory cells MC0-MC31 connected in series. One end of the each NAND cell unit is connected to bit lines BL (BLe_0, BLo_0, . . . , BLe_k -BLo_k) via selection gate transistors SG1 connected to a Selection Gate Line SGD_i, respectively. The other end of the each NAND cell unit is connected to a common source line CELSRC via selection gate transistors SG2 connected to a Selection Gate Line SGS_i. A control gate of each memory cell MC is connected to Word Lines WL (WL0_i-WL31_i). The even number Bit lines BL_e counting from zero and the odd number Bit lines BL_o counting from zero perform programming and reading-out of data independently of each other. Among 2*k memory cells connected to one Word Line WL, programming and reading-out data are performed at the same time to k memory cells connected to the even number Bit lines BL_e. Each memory cell stores 2-bit data, and these k memory cells configure a unit called "a page".

Similarly, another page is configured with the k memory cells that are connected to one Word Line WL and the odd number Bit line BL_o, thus programming and reading-out data are performed at the same time to the memory cells in the page.

Figure 8:
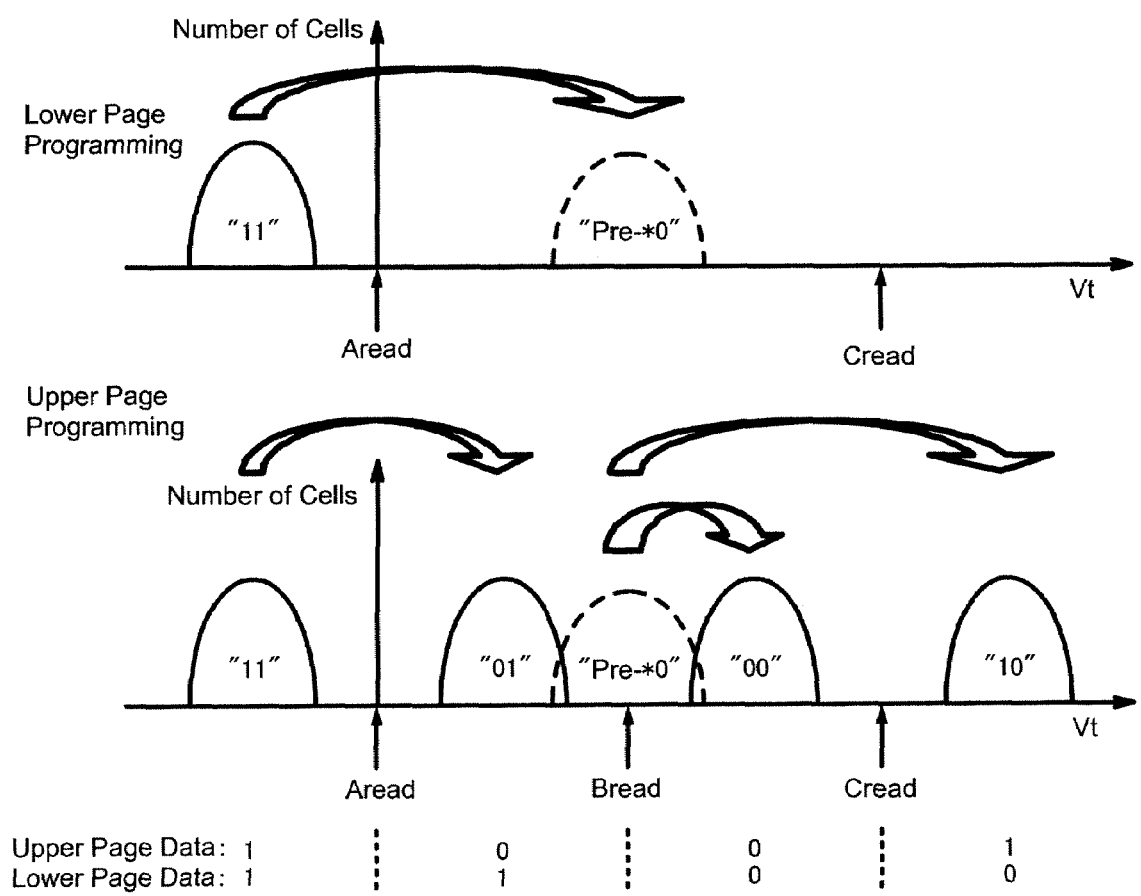
FIG. 8 is an exemplary relationship between threshold voltage (Vt) distribution and data in the NAND type flash memory device 1 according to one embodiment of the non-volatile semiconductor memory device of the present invention.

Further in this embodiment, a number of blocks configuring the memory cell are set to m and one block includes 2 n NAND memory cell units providing 32 memory cells. However, the present invention is not limited to this; the number of blocks, and the number of memory cells and the number of memory units may be changed in accordance with desired capacity of the NAND type flash memory device. Next, data programming operation of the NAND type flash memory device 1 of this embodiment will be explained. In FIG. 8, an example of the relationship between the threshold voltage (Vt) distribution and the data in the multi-level NAND type flash memory device 1 of this embodiment, in which 2-bit is stored into one memory cell, is shown. In the example, the 2-bit stored into one memory cell is allocated as data of a different page. In other words, in the NAND type flash memory device, read-out operation and programming operation are performed on every page unit such as 2 Kbytes or 512 bytes. In the case that such a multi-level memory is performed, data corresponding to the two row addresses are stored into the one memory cell. The two row addresses will be hereinafter called as "lower page" and "upper page".

In the example shown in FIG. 8, the memory cell becomes an erased cell ("11") in the beginning. Then, data are programmed into a lower page of the memory cell. In the case of programming "0" data into the lower page, programming is performed shifting the threshold voltage (Vt) from "11" distribution to "Pre-* 0" distribution (see FIG. 8 upper section for reference). The "Pre-*0" distribution is a distribution located almost in the center between the "11" distribution and "10" distribution. On the other hand, in the case of programming "1" data into the lower page, the threshold voltage (Vt) is not shifted (not shown in the figure).

Next, data are programmed into an upper page of the memory cell. Now in the case of programming "0" data into the upper page and the "1" data being stored in the lower page, programming is performed shifting the threshold voltage (Vt) from "11" distribution to "01" distribution, (see the lower section of FIG. 8 for reference). Also in the case of programming "0" data into the upper page and "0" data being stored in the lower page, programming is performed shifting the threshold voltage (Vt) from the "Pre-*0" distribution to the "00" distribution (see the lower section of FIG. 8 for reference). When the "1" data are programmed into the upper page and "0" data are stored in the lower page, programming is performed shifting the threshold voltage (Vt) from the "Pre-* 0" distribution to the "10" distribution (see the lower section of FIG. 8 for reference). In addition, in the case of programming the "1" data into the upper page and "1" data being stored in the lower page, the threshold voltage (Vt) is not shifted (not shown in the figure).

In addition, in the case as such that the threshold voltage (Vt) distribution after programming of the lower page is different from the threshold voltage (Vt) distribution after programming of the upper page, it is necessary to distinguish in which state the memory cell is so as to read out these data correctly. This is because the data amount programmed sequentially in the non-volatile semiconductor memory device may be equivalent to the amount of the odd pages, and the data may not always be programmed into both of the lower page and the upper page of all the memory cells, thus the memory cell, in which data is programmed only to the lower page, may not be generated. Therefore, during the upper page programming, in the bit of a special address bit which is invisible from a user (hereinafter referred to as "a LM flag"), a mechanism to program data is provided into a position of the "01" distribution of FIG. 8. By providing this mechanism, it becomes unnecessary that data is programmed into both sides of the lower page and the upper page of all the memory cells, and then there may be the memory cell in which data are programmed only into the lower page.

In the example, data read-out is performed as follows: in the memory cell in which data programming is performed only into the lower page, data read-out is performed by checking the LM flag after the A read-out and outputting data of the A read-out of the lower page. In other words, in this case, because it is performed before upper page programming, the threshold voltage (Vt) of a bit of the LM flag of the special address is "11". If potential of the selected word line is read-out in the A read-out, the memory cell of the LM flag bit is in an on-state. In this case, it is set to become an "L" judgment for the LM flag. According to this LM flag judgment data, it is distinguished that programming of the upper page is not performed. Therefore, data of the lower page outputting outside of a chip may be left as the read-out setting the potential of the selected word line to be the A read-out. Also in the reading-out of the data of the upper page in this case, A read-out is performed after C read-out, and then the LM flag is checked. Here in the "Pre-*0" distribution, the data stored on an upper page are equivalent to "0" data. However, the data stored on an upper page is set to be a "1" data automatically. In other words, the threshold voltage (Vt) of the LM flag bit before the upper page programming is "11" states. If the potential of the selected word line is set to be C read-out and A read-out, it is set to be an "L" judgment as the LM flag bit. Hereby it is distinguished that the data of the upper page is not yet programmed. Therefore, the data of the upper page that is output toward the outside of the chip may be set to be the "1" data regardless of the data which a sense amplifier has read-out.

Next, in the case that data programming is performed also into the upper page, data read-out of the lower page is performed by checking the LM flag is checked after the A read-out, and further thereafter by performing the B read-out and outputting data by the B read-out. In other words, in this case, a result of B read-out is required to output the correct data, because the data of the LM flag is judged to be "H", not to be "L". Also, data read-out of the upper page in this case is performed by performing A read-out after C read-out, further thereafter by checking the LM flag and outputting the data by C read-out and A read-out. In other words, in this case, the data of the LM flag is judged to be "H", not to be "L". Therefore, to output the correct data, a read-out result of a sense amplifier, in which data processing is performed seen in such a result as of A read-out and C read-out, in which "0" is the result in the case that existing threshold voltage (Vt) between A read-out and C read-out and the case of the vice versa result in "1".

In the NAND type flash memory device of a method using the LM flag, read-out of the data becomes slightly complicated compared to a conventional multi-level NAND type flash memory device of the MLC method. However, shift step of the threshold voltage (Vt) distribution at the time of data programming may be suppressed practically. As a result, an interference effect among the memory cells may be suppressed.

Figure 9:
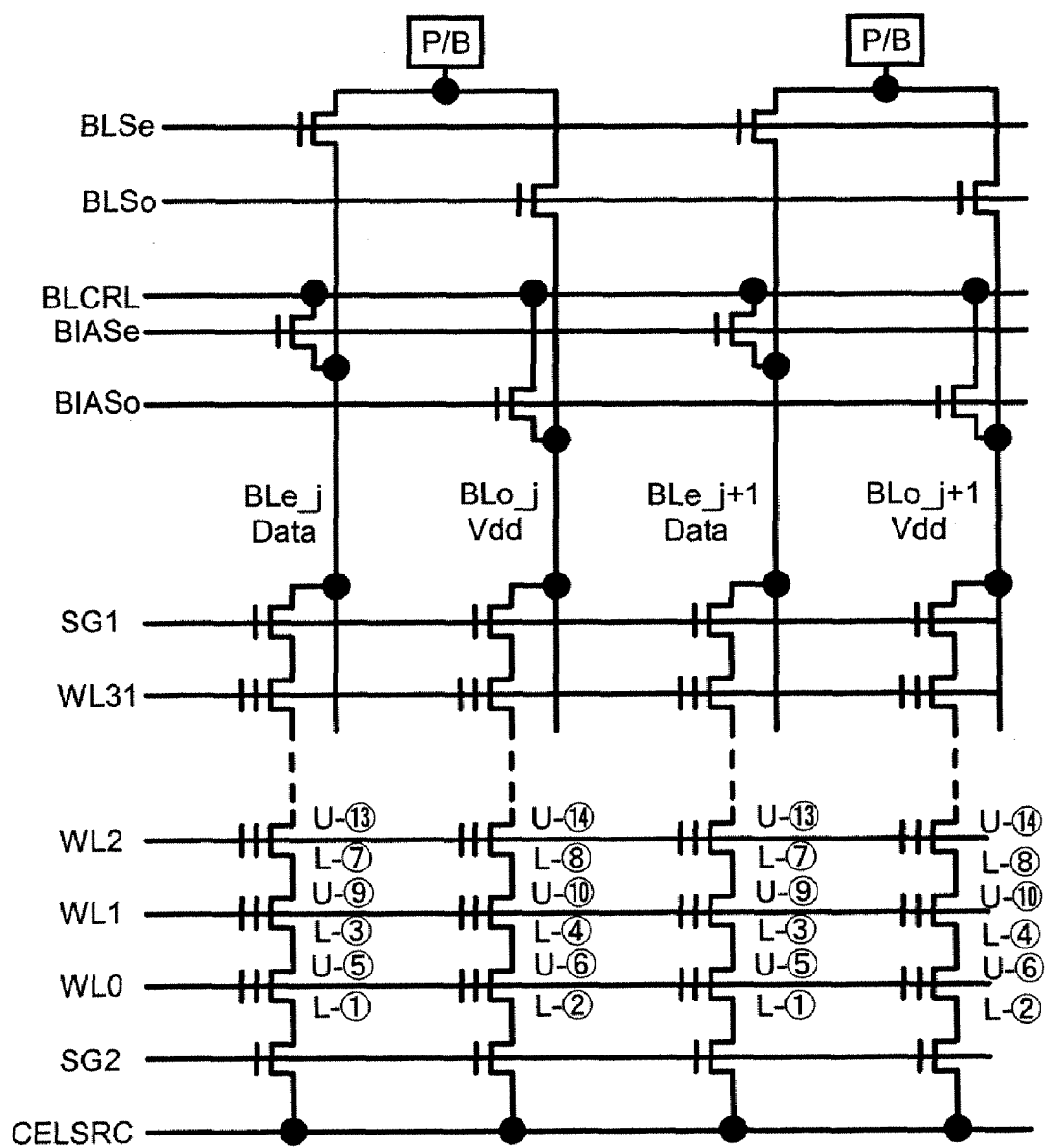
FIG. 9 is a diagram showing an example of the order of data programming of the NAND type flash memory device 1 according to one embodiment of the non-volatile semiconductor memory device of the present invention.

Next, referring to FIG. 9, an example of programming the order of data of the NAND type flash memory device 1 of this embodiment is explained. In this embodiment, in the case that programming is performed to both of the lower page and the upper page, as shown in FIG. 9, it is preferable that data programming be performed in order of the numbers of the figure such as: lower pages of the memory cells which are connected to a Word Line WL0 and are connected to even number bit lines BLe ( . . . , BLe_j, BLe_j+1, . . . ) respectively; lower pages of the memory cells which are connected to the Word Line WL0 and are connected to odd number Bit Lines BLo ( . . . , BLo_j, BLo_j+1, . . . ) respectively; lower pages of the memory cells which are connected to a Word Line WL1 and are connected to the even number Bit Lines BLe ( . . . , BLe_j, BLe_j+1, . . . ) respectively; lower pages of the memory cell which are connected to the Word Line WL1 and are connected to the odd number Bit Lines BLo ( . . . , BLo_j, BLo_j+1, . . . ) respectively; upper page of the memory cells connected to the Word Line WL0 and are connected to the even number Bit Lines BLe ( . . . , BLe_j, BLe_j+1, . . . ) respectively. Thus, generation of coupling noises among floating gates (FG) may be reduced by programming of the upper page of a certain memory cell after programming of the lower page of the memory cell adjacent to the bit line side of the certain memory cell.

Figure 10:
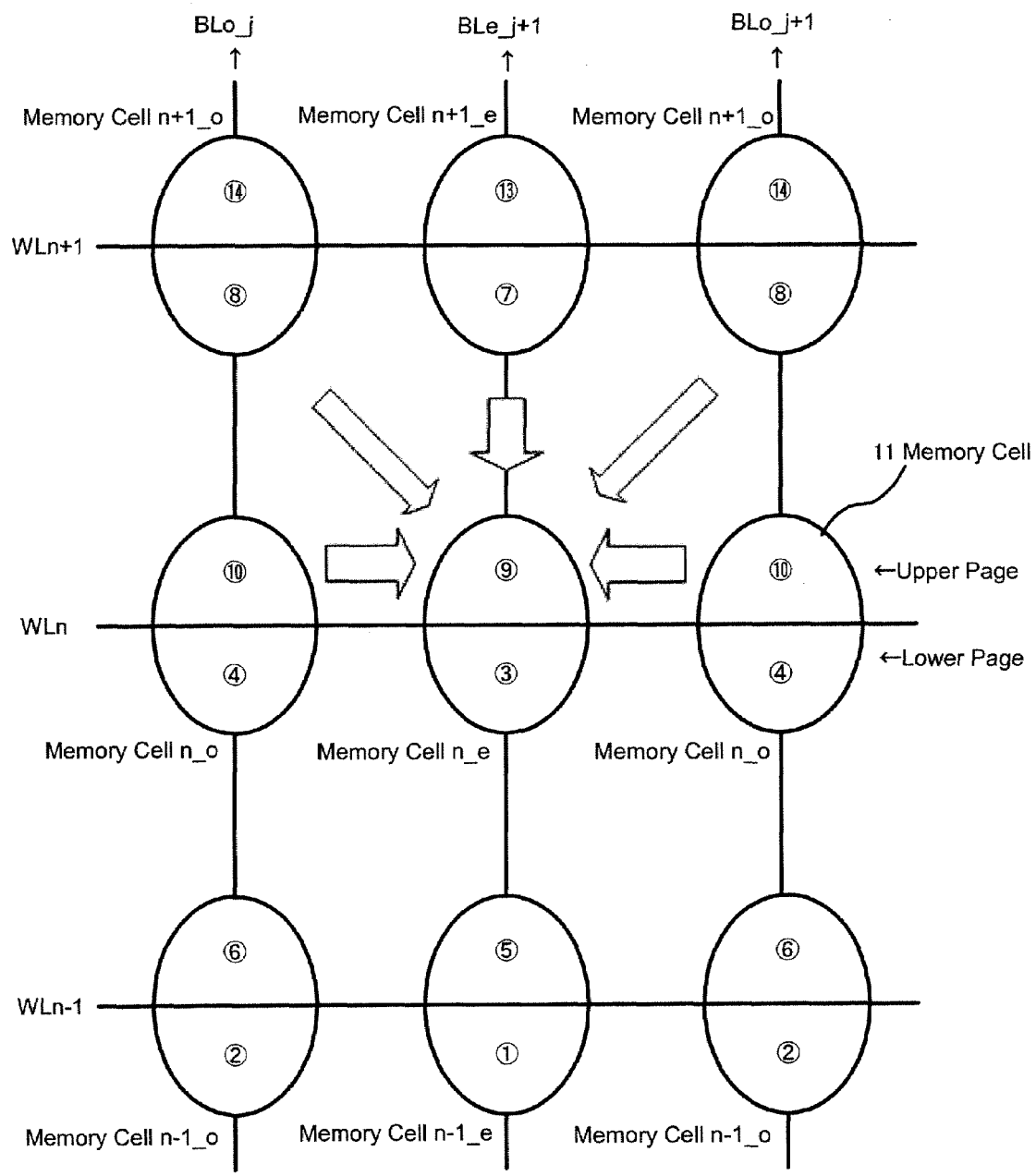
FIG. 10 is a diagram showing an example of coupling noise generation among the floating gates (FG) of the NAND type flash memory device 1 according to one embodiment of the non-volatile semiconductor memory device of the present invention.
Figure 11:
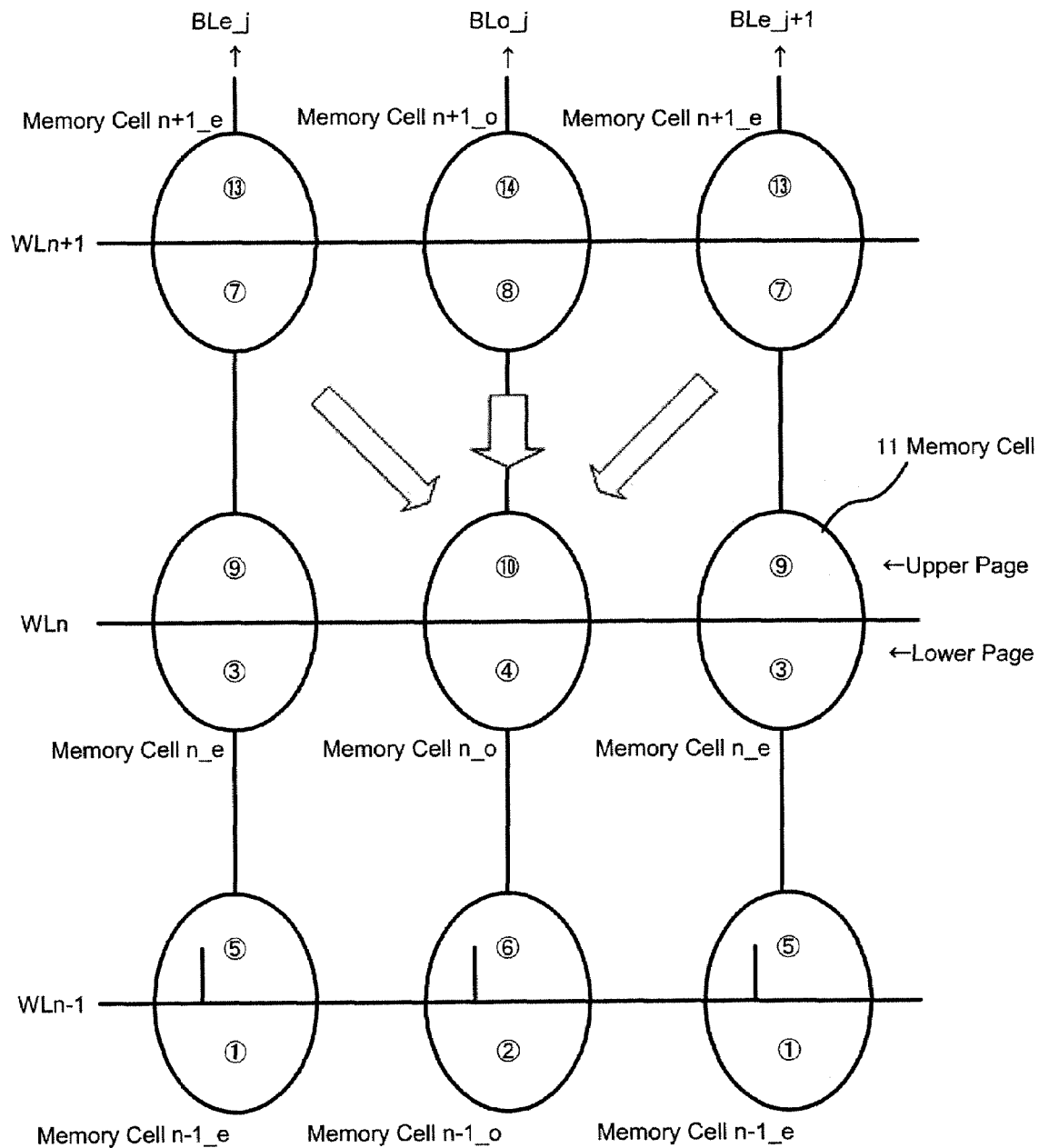
FIG. 11 is a diagram showing another example of coupling noise generation among the floating gates (FG) of the NAND type flash memory device 1 according to one embodiment of the non-volatile semiconductor memory device of the present invention.

Next, referring FIG. 10 and FIG. 11, generation of coupling noises among floating gates (FG) in the above-described case is explained in detail. In addition, FIG. 10 is an example when focusing attention on a cell n_e.

In FIG. 10, the nine ovals represent memory cells 11, the top halves of which represent upper pages of the memory cell 11 and the bottom halves represent lower pages of the memory cells 11. In addition, the numbers in the oval show a programming order of data. The vertical lines in FIG. 10 are connected to Bit Lines BL ( . . . , BLo_j, BLe_j+1, BLo_j+1, . . . ). Further in FIG. 10, the Bit Lines BLe_j+1 are even number Bit Line BL counting from zero, and the Bit Lines BLo_j and the BLo_j+1 are odd number bit lines BL counting from zero. Further in FIG. 10, the horizontal lines represent Word Lines WL ( . . . , WLn−1, WLn, WLn+1, . . . ).

In the example shown in FIG. 10, in accordance with the order of data programming shown in the above-mentioned FIG. 9, for example, programming of data is performed in order of the numbers in the ovals such as: the lower page of the memory cell n−1_e, the lower page of the memory cell n−1_o, the lower page of the memory cell n_e, the lower page of the memory cell n_o, the upper page of the memory cell n−1_e, and so on shown in FIG. 10. Here, focusing attention on the memory cell n_e on the center of the figure, after programming of the memory cell n_e and at the time of programming the upper page of the adjacent memory cell n_o, the memory cell n+1_e, and the memory cell n+1_o, data programming may be performed, in which threshold voltage (Vt) of a memory cell shown in the above-mentioned FIG. 8 is shifted from a "11" distribution to a "01" distribution or a threshold voltage (Vt) distribution of a memory cell; or in which the threshold voltage (Vt) of a memory cell is shifted from a "Pre-*0" distribution to a "10" distribution. However in the example, the coupling noises among the floating gates (FG) are generally reduced by half because the shift step of the threshold voltage (Vt) is inhibited as compared to a multi-level NAND type flash memory device of the conventional MLC method.

Next in FIG. 11, the nine ovals represent memory cells 11, the bottom halves of which represent lower pages of the memory cells 11 and the top halves of which represent upper pages of the memory cells 11. In addition, the numbers in the ovals show an order of programming data. The vertical lines in FIG. 11 are connected to the Bit Lines BL ( . . . , BLe_j, BLo_j, BLe_j+1, . . . ). Further, in the figure, the bit line BLe_j and the BLe_j+1 are the even number Bit Lines counting from zero, and the Bit Line BLo_j is an odd number Bit Line BL counting from zero. Further, in FIG. 11, the horizontal lines represent Word Line WL ( . . . , WLn−1, WLn, WLn+1, . . . ).

In the example shown in FIG. 11, programming of data is performed in order of the numbers of the ovals, such as: a lower page of a memory cell n−1_e; a lower page of a memory cell n−1_o; a lower page of a memory cell n_e; a lower page of a memory cell n_o; an upper page of the memory cell n−1_e, and so on. Here, focusing attention on the memory cell n_o on the center in FIG. 11, after programming of the memory cell n_o and at the time of programming the upper page of the adjacent memory cell n+1_o, the memory cell n+1_e, and the memory cell n+1_o, data programming may be performed, in which threshold voltage (Vt) of the memory cell shown in the above-mentioned FIG. 8 is shifted from a "11" distribution to a "01" distribution of a memory cell; or in which the threshold voltage (Vt) of a memory cell is shifted from a "Pre-*0" distribution to a "10" distribution. However in the example, the coupling noises among the floating gates (FG) are generally reduced by half because the shift step of the threshold voltage (Vt) distribution is suppressed as compared to a multi-level NAND type flash memory device of the conventional MLC method.

Figure 12:
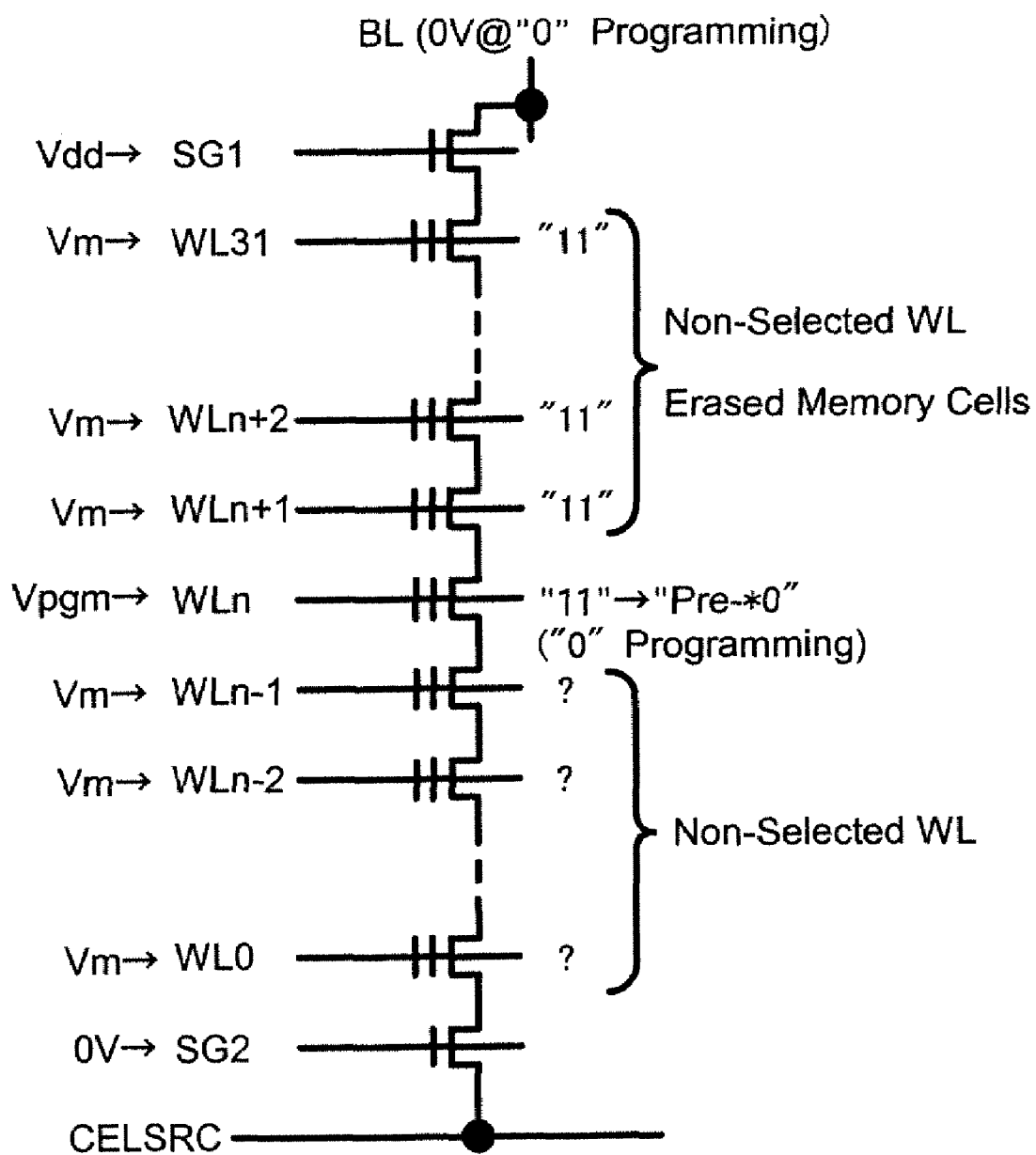
FIG. 12 is a diagram showing an example of a programming pulse applied state in the case of programming "0" data into a lower page of a memory cell (a selected memory cell) connected to a selected Word Line WLn of the NAND type flash memory device 1 according to one embodiment of a non-volatile semiconductor memory device of the present invention.
Figure 13:
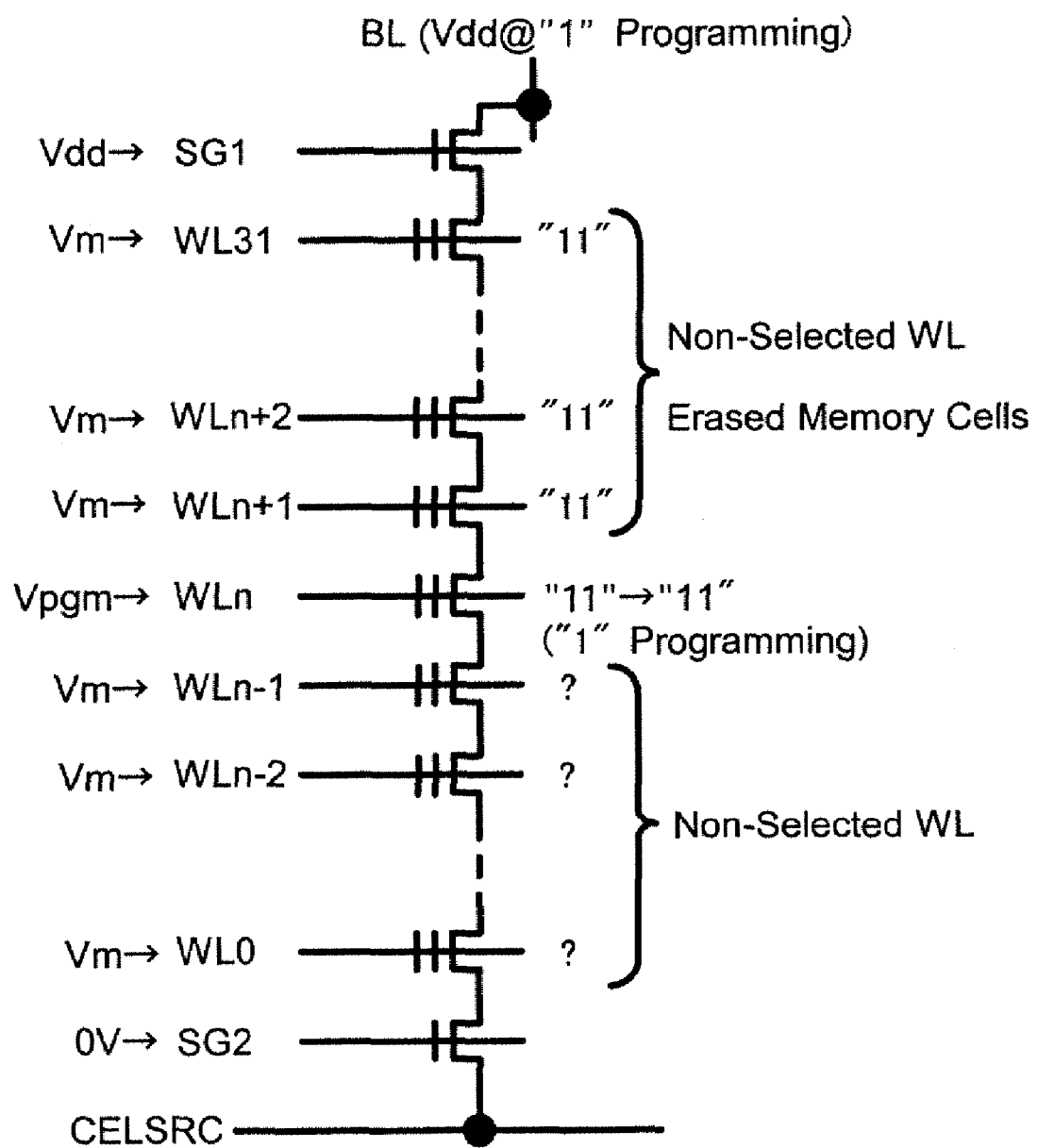
FIG. 13 is a diagram showing an example of the programming pulse applied state in the case of programming "1" data into the lower page of the memory cell (the selected memory cell) connected to the selected Word Line WLn of the NAND type flash memory device 1 according to one embodiment of the non-volatile semiconductor memory device of the present invention.
Figure 14:
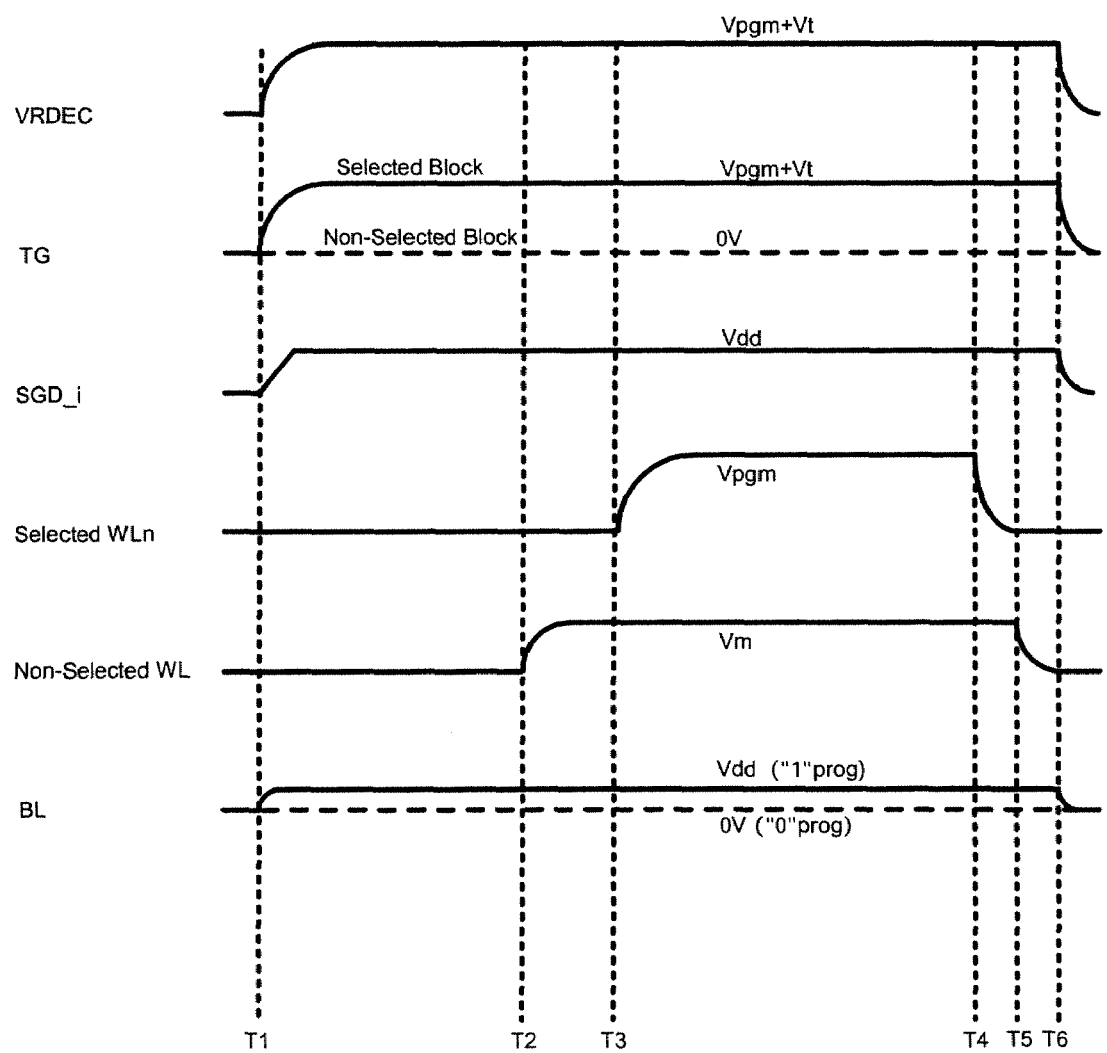
FIG. 14 is a diagram showing an example of a programming pulse shape in a lower page programming of the NAND type flash memory device 1 according to one embodiment of the non-volatile semiconductor memory device of the present invention.

Next in FIG. 12 and FIG. 13, an example of a programming pulse applied state in the case that data are programmed into the lower page of the memory cell (the selected memory cell) connected to the selected Word Line WL in this embodiment. In addition, FIG. 12 is an example in the case that "0" data are programmed into the lower page, and FIG. 13 is an example in the case that "1" data are programmed into the lower page. As shown in the figure, programming voltage Vpgm is applied to the selected Word Line WLn, and programming pass voltage Vm is applied to the other non-selected Word Lines. Then, all of the memory cells connected to the non-selected Word Lines of the Bit Line BL side above the selected Word Line WLn become a erased cell ("11"), and it does not become the data memory state such as a remarkable increase in erratic programming at the time of "1" data programming in which the threshold voltage (Vt) is shifted. An example of a programming pulse shape in the lower page programming of this embodiment is shown in FIG. 14.

At first, at the time T1, 0V ("0" data programming) or power source voltage Vdd ("1" data programming) is applied to the Bit Line BL, and power source voltage Vdd is applied to the bit line BL-side Selection Gate Line SGD_i in accordance with programming data. In addition, voltage for transfer to transfer the desired programming voltage toward the word lines is output into the signal line VRDEC. The transfer voltage that is applied to the VRDEC is output toward a gate of the output transistors inside the selection block decoder in a selection block. On the other hand, in a block decoder in a non-selected state, 0 V is applied to the gate of output transistors. Thereby, a desired voltage to be hereinafter described may be applied to a word line of the selection block.

Subsequently, at the time T2, programming pass voltage Vm is applied to the non-selected Word Lines WL.

Afterwards, at the time T3, programming voltage Vpgm is applied to the selected Word Line WLn.

Afterwards, at the time T4, supply of programming voltage Vpgm to the selected Word Line WLn is suspended, and then the selected Word Line WLn is discharged to 0 V. In other words, acutual data programming to the memory cell (the selected memory cell) connected to the selected Word Line WLn is ended.

Afterwards, at the time T5, supply of programming pulse voltage Vm toward the non-selected Word Lines are sustained, and then the non-selected Word Lines are contact to ground respectively.

Afterwards, at the time T6, the bit lines and the Selection Gate SGD_i (SG1) are discharged to 0V, and the power source voltage VRDEC for row decoders is discharged to Vdd so that a sequence of programming pulses applied operation is finished. Afterwards, verification operation for the data programming is performed.

If there exists a bit which is judged to be insufficient programmed by a result of the verification operation, the programming pulse applied operation is performed; thus the "0" data programming states are held. On the other hand, the bit which is judged to be sufficient programmed is set in the later programming pulse applied operation to "1" data programming state. In this way, the programming pulse applied operation and the verification operation are repeated until all bits to be programmed are programmed to predetermined levels so that the data programming operation is completed.

Figure 15:
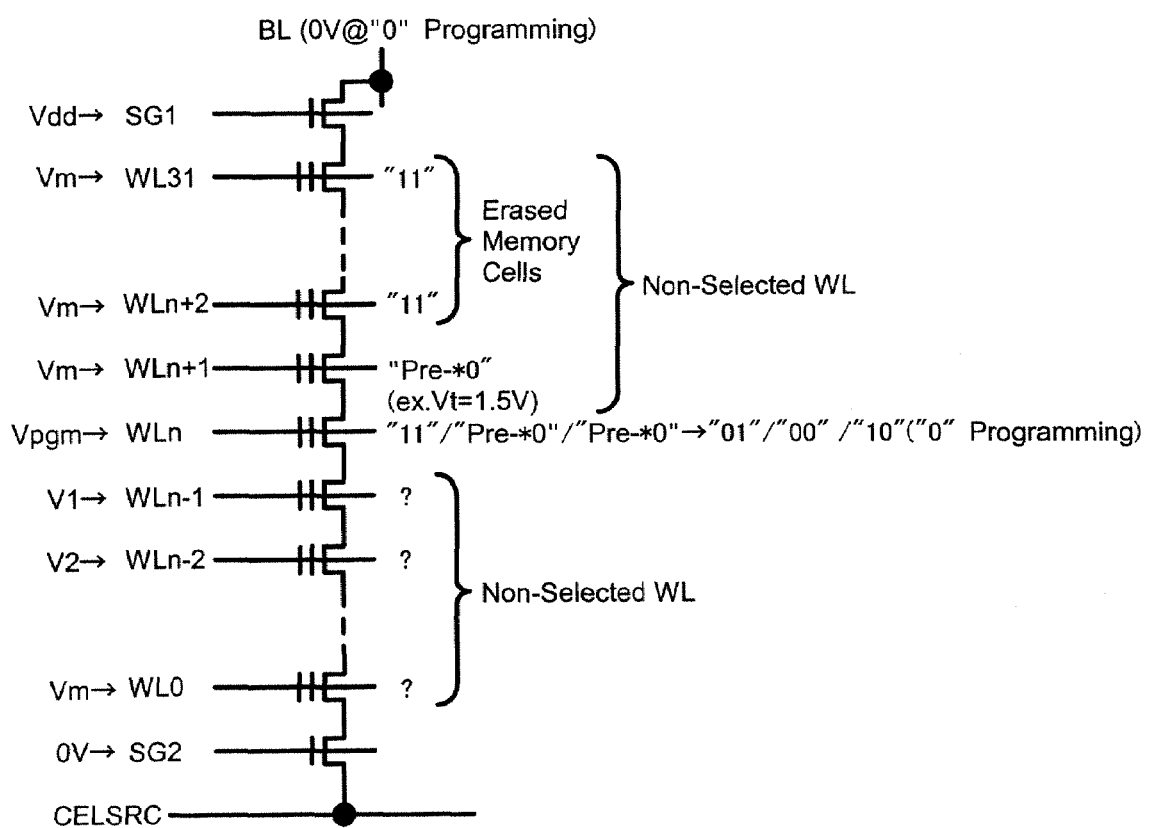
FIG. 15 is a diagram showing an example of the programming pulse applied state in the case of programming data into the upper page of the memory cell (the selected memory cell) connected to the selected Word Line WLn of the NAND type flash memory device 1 according to one embodiment of a non-volatile semiconductor memory device of the present invention.
Figure 16:
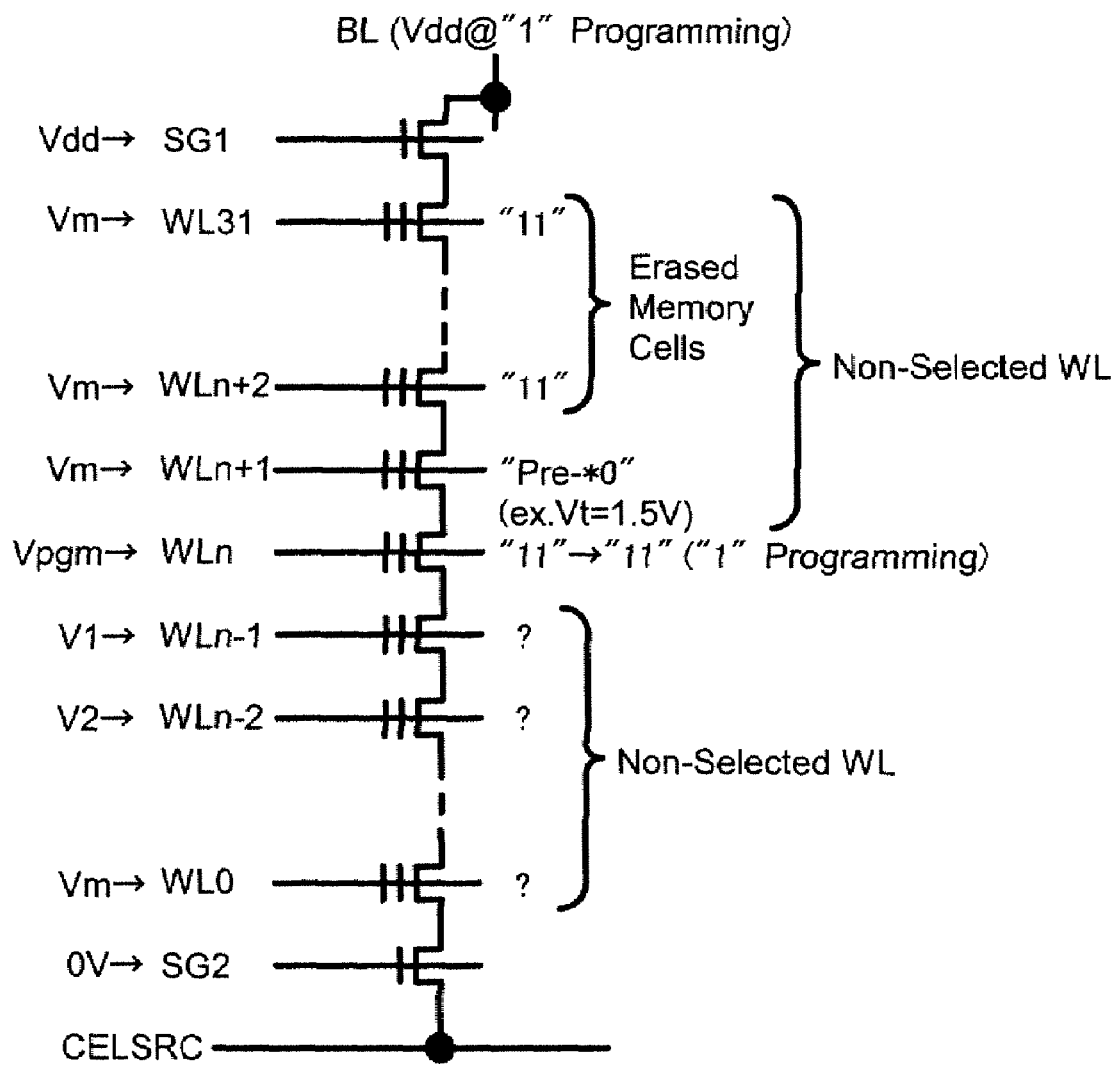
FIG. 16 is a diagram showing an example of the programming pulse applied state in the case of programming data into the upper page of the memory cell (the selected memory cell) connected to the selected Word Line WLn of the NAND type flash memory device 1 according to one embodiment of a non-volatile semiconductor memory device of the present invention.

Next in this embodiment, an example of a programming pulse applied state in the case that data are programmed into an upper page of the memory cell (the selected memory cell) connected to the selected Word Line WLn is shown in FIGS. 15 and 16. In addition, FIG. 15 is an example in the case that "0" data are programmed into the upper page; and FIG. 16 is an example in the case that "1" data are programmed into the upper page. Here, in accordance with a programming order shown in the above-described FIG. 9, a memory cell connected to the non-selected Word Line WLn+1 adjacent to the Bit Line BL side of the selected Word Line WLn is in a "Pre-*0" state. As is apparent from the above-mentioned FIG. 8, in the lower page programming and upper page programming, there is a difference among the threshold voltage (Vt) distribution of a page to be programmed; a higher programming voltage is required to the upper page programming. Therefore, in the upper page programming, in the case of "1" data programming, in which the threshold voltage (Vt) is not shifted, sufficient erratic programming tolerance is required. However, as shown in FIG. 15 and FIG. 16, if there is a memory cell already in the programmed state in the memory cell connected to the non-selected Word Lines located in the Bit Line side from the selected Word Line WLn, tolerance of the erratic programming may be reduced.

Figure 17:
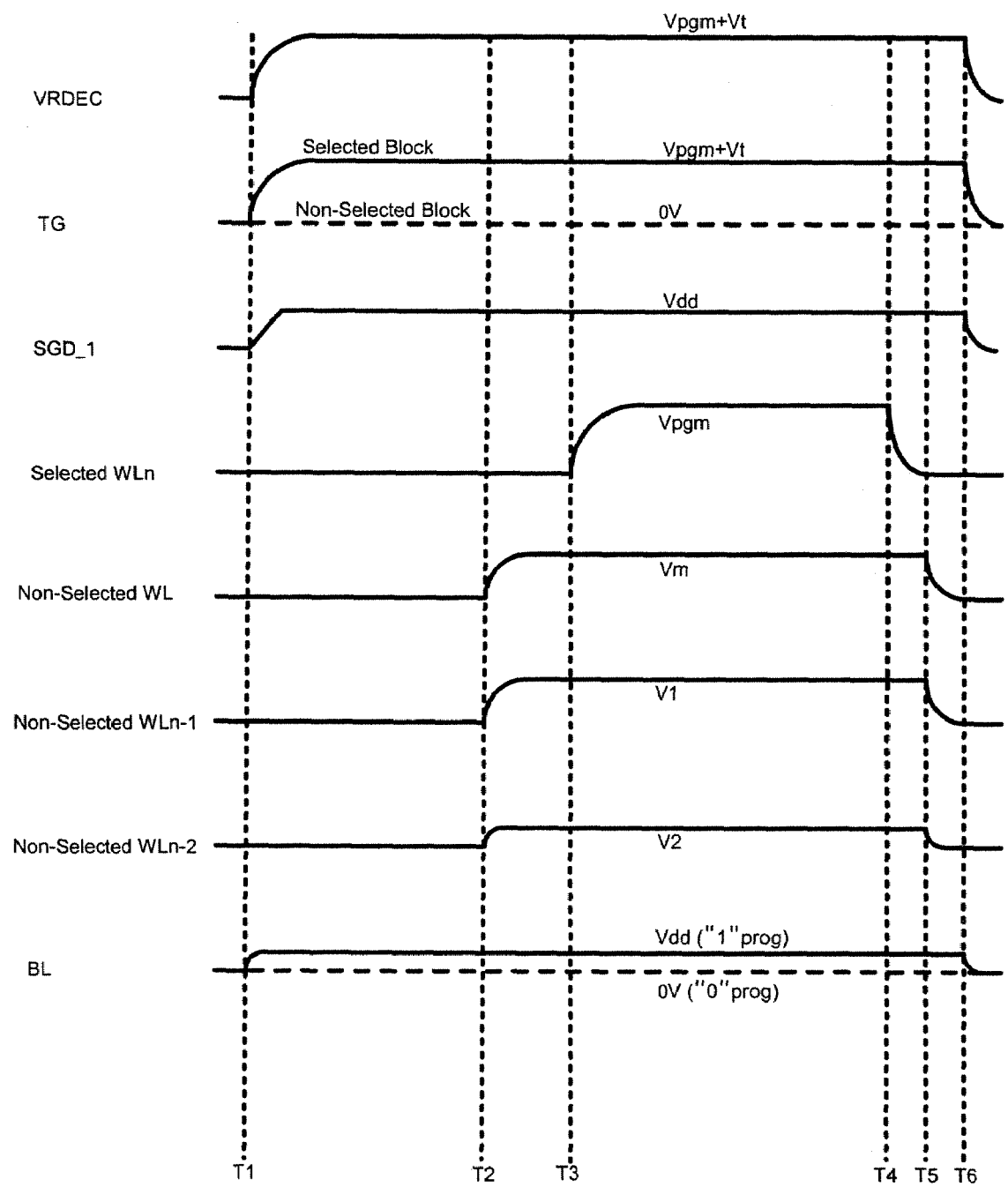
FIG. 17 is a diagram showing an example of a programming pulse shape in an upper page programming of the NAND type flash memory device 1 according to one embodiment of the non-volatile semiconductor memory device of the present invention.

Thus, voltage V1 is applied to the first non-selected Word Line WLn−1 adjacent to the source line CELSRC side of the selected word line, and voltage V2 that is different from the voltage V1 is applied to the second non-selected Word Line WLn−2 adjacent to source line CELSRC side of the first non-selected word line. Here, for example, the voltage V1 is the voltage that has a certain relationship with the verification voltage which decides a threshold voltage (Vt) of the "10" distribution in the above-mentioned FIG. 8; and the voltage V2 is, for example, 0V. An example of a programming pulse shape in the upper page programming in this embodiment is shown in FIG. 17.

At first, at the time T1, 0V ("0" data programming) or the power source voltage Vdd ("1" data programming) is applied to the Bit Line BL, and the power source voltage Vdd is applied to the bit line side Selection Gate Line SGD_i in accordance with the programming data. In addition, transferring voltage for transferring to transfer a desired programming voltage to the word line is output to the signal line VRDEC, and the transfer voltage applied to the VRDEC is output to a gate of an output transistor inside the selected block decoder in a selected block. On the other hand, in a block decoder of a non-selected state, 0V is applied to the gate of the output transistors. Hereby a desired voltage to be hereinafter described may be applied to the word line of a selection block.

Then, subsequently, at the time T2, at the same time as applying voltage V1 to the first non-selected Word Line WLn−1, the voltage V2 that is different to the voltage V1 is applied to the second non-selected Word Line WLn−2, and the programming pass voltage Vm is applied to the non-selected Word Line WL except for the first non-selected Word Line WLn−1 and the second non-selected Word Line WLn−2.

Afterwards, at the time T3, programming voltage Vpgm is applied to the selected Word Line WLn.

Afterwards, at the time T4, supply of programming voltage Vpgm to the selected Word Line WLn is sustained, and then the selected Word Line WLn is discharged to 0V. In other words, actual programming of data to the memory cell (the selected memory cell) connected to the Selected Word Line WLn is ended.

Afterwards, at the time T5, supply of voltage V1 to the first non-selected Word Line WLn−1, supply of voltage V2 to the second non-selected Word Line WLn−2, and supply of programming pass voltage Vm to non-selected Word Line WL except for the first non-selected Word Line WLn−1 and the second non-selected Word Line WLn−2 are stopped at the time T5, and these word lines are connected to ground respectively.

Afterwards, at the time T6, the bit line and the selection gate SGD_i (SG1) are discharged to 0V, voltage of the power source VRDEC for the row decoder is discharged to Vdd, and thus a sequence of programming pulses applied operation is completed. Afterwards, verification operation of the data programming is performed.

If there is a bit that is judged to be insufficient by the result of the verification operation, pulse applied operation is again performed, whereby "0" data programming states are held. On the other hand, a bit which is judged to be sufficient in programming is set to a "1" data programming state in the later programming pulse applied operation. In this way, the programming pulse applied operation and the verification operation are repeated until all bits to be programmed to predetermined levels are programmed, thus data programming operation is completed.

A summary of an applied voltage at the time of the lower page programming in this embodiment and an applied voltage at the time of the upper page programming is shown in FIG. 18.

As explained in the above, in a method of upper page programming operation of the NAND type flash memory device 1 in this embodiment, a voltage V1 is applied to the first non-selected Word Line WLn−1 at the time of the programming operation; at the same time, a voltage V2 which is different from the voltage V1 is applied to the second non-selected Word Line WLn−2. Thus, voltages of an N type diffusion layer and within the NAND cell unit at the Bit Line BL side and the Source Line CELSRC side and the channel area of the memory cell may be electrically separated, being the second non-selected Word Line WLn−2 to which voltage V2 is especially applied as a boundary. Consequently the channel voltage of the memory cell (the selected memory cell) connected to the selected Word Line WLn at the time of "1" data programming may be sufficiently boosted. Thereby in the upper page programming, programming tolerance at the time of "1" programming, in which a threshold voltage (Vt) is not shifted, may be highly increased. A merit for using a programming pulse applied operation such as FIG. 14 at the lower page is that it is easy to reduce the time which is necessary for the programming pulse applied voltage as compared with the programming pulse applied operation shown in FIG. 17, and that the programming voltage that is applied to the selected word line tends to be lower. Because the Vm is applied to the non-selected word line on either side of selected word line, the non-selected word line of both sides of the selected word line, coupling of a memory cell (the selected memory cell) connected to the selected Word Line WLn is preferable in appearance as compared with programming pulse applied operation of FIG. 17. Therefore in FIG. 14, it is possible to reduce net programming time between T3 and T4; if this programming pulse applied operation is used to the lower page, it is profitable to reduce the programming time.

The non-volatile semiconductor memory device according to one embodiment of the present invention and the driving method thereof, has an outstanding effect which is; a highly reliable non-volatile semiconductor memory device, in which coupling noises among floating gates (FG) are suppressed without requiring a big change for element structures of the conventional NAND type flash memory device, and in which generation of erratic programming is suppressed.

EMBODIMENT 1

In this embodiment, another driving method of the NAND type flash memory device according to embodiments of the non-volatile semiconductor memory device of the present invention will be explained.

This embodiment is similar to the NAND type flash memory device 1 of the above-mentioned embodiment except for a driving method at the time of data programming. Therefore the detail of the configuration of the NAND type flash memory device 1 will not be explained here again.

In this embodiment, depending on the memory cell characteristic, boosted voltage of the channel may increase more than expected so that erratic programming can occur in a memory cell that should have a non-programming state due to a leakage current generating at the place where an electric field has concentrated within a NAND cell unit.

As shown in the above-mentioned FIG. 16, for example, in the case that there exist about 1.5V programming states in the third non-selected Word Line WLn+1 adjacent to bit line BL side of selected Word Line WLn, and in the case that the data has a threshold voltage (Vt) which is higher programmed into the first non-selected Word Line WLn−1 and the second non-selected Word Line WLn−2, the boosted voltage of a channel of the memory cell (the selected memory cell) connected to the selected Word Line WLn can increase more than required.

A voltage of a channel area of the non-selected Word Lines WLn+2-WL31 and N type diffusion area between those memory cells connected to become a coupling voltage in accordance with the amplitude of the programming pass voltage Vm applied to the non-selected Word Line WL because the data are not programmed into those memory cells. The voltage of a channel of the memory cells connected to the non-selected Word Line WLn+1 becomes the voltage of the coupling voltage minus the threshold voltage (Vt) of the memory cells connected to the non-selected Word Line WLn+1. In other words, a memory cell connected to the non-selected Word,Line WLn+1 can be easily CUT OFF than a memory cell connected to the selected Word Lines WLn+2-WL31. In addition to this state, if the data having high a threshold voltage (Vt) are being programmed into the first non-selected Word Line WLn−1 and the second non-selected Word Line WLn−2, the coupling between a channel of the selected Word Line WLn and the selected Word Line WLn becomes a highly condition. Therefore, the voltage of the channel of the selected Word Line WLn side and the voltage of the channel of the non-selected Word Line WLn+2-WL31 are electrically separated being the second non-selected Word Line WLn−2 to which voltage V2 is especially applied as a boundary; and the channel voltage of the selected Word Line WLn side increases. Hereby a condition, in which leak current caused by generation of so-called "GIDL" (Gate Induced Drain Leakage) flows easily at a drain side of the memory cell connected to the first non-selected Word Line WLn−1. This causes erratic programming on the memory cell (the selected memory cell) connected to the selected Word Line WLn.

Thus, in the case that it is clear that the memory cell is weak for erratic programming due to such GIDL, the programming pulse shown in the above-mentioned FIG. 17 is used in a programming operation of the lower page in reverse of the above-mentioned embodiment and the programming pulse shapes shown in the above-mentioned FIG. 14 are used in a programming operation of the upper page. Therefore, the applied voltage at the time of lower page programming and the applied voltage at the time of upper page programming in this embodiment are as shown in FIG. 19. Except for these the other elements are set the same as in the above-mentioned embodiment. In the case that the programming pulse shapes shown in the above-mentioned FIG. 14 are used, program error due to the GIDL may be suppressed, because such a local boosted state caused by a combination of data of the non-selected Word Line WLn+1 and the first non-selected Word Line WLn−1 does not occur.

In addition, as shown in above-mentioned FIG. 8, the threshold voltage to be programmed for the upper page is higher than that for lower page so that higher programming voltage Vpgm is required at the upper page programming. If the programming voltage Vpgm becomes higher, higher performance is required to: the pump circuit which generates such a high voltage; and a transistor used in a driving circuit on the signal paths supplying programming voltage to the selected Word Line. In the NAND type flash memory device, the programming voltage Vpgm is necessary for programming to a desired threshold voltage (Vt) is determined by the coupling ratio with the adjacent Word Line and the Floating Gate (FG) as well as the coupling ratio with the Floating Gate (FG) and the Word Line (a control gate) of a memory cell to be focused on. Thus, if the voltage of the non-selected Word Line adjacent to the selected Word Line WLn is high, the programming voltage Vpgm becomes low. Therefore, as in this embodiment, the use of the programming pulse shapes shown in the above-mentioned FIG. 14, may suppress a increase of the voltage Vpgm in a programming operation of an upper page.

EMBODIMENT 2

In this embodiment, another driving method of the NAND type flash memory device according to embodiments of the non-volatile semiconductor memory device of the present invention will be explained.

This embodiment is similar to the NAND type flash memory device 1 of the above-mentioned embodiment except for a driving method at the time of data programming. Therefore the detail of the configuration of the NAND type flash memory device 1 will not be explained here again.

Figure 20:
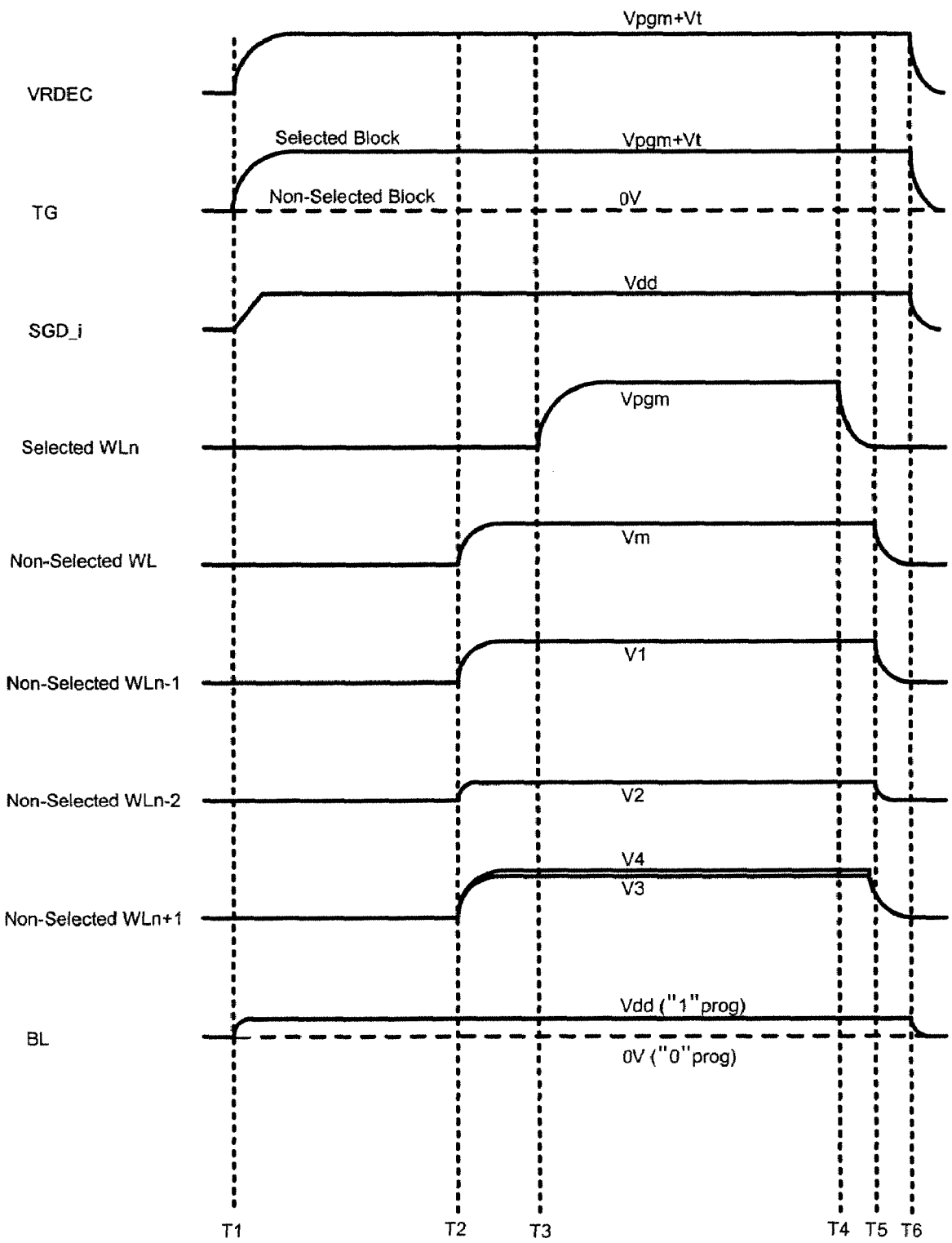
FIG. 20 is a diagram showing an example of a programming pulse shape of the NAND type flash memory device 1 according to one embodiment of the non-volatile semiconductor memory device of the present invention.

In this embodiment, programming pulses are set as shown in FIG. 20. A summary of applied voltages at the time of the lower page programming in this embodiment and applied voltage at the time of the upper page programming is shown to FIG. 21. This programming pulse applying method resembles the programming pulse applying method as shown in FIG. 17. However, the voltage applied to the non-selected cell WLn+1 at the time of lower page programming is set at V3 ($\leq$Vm). Except for these the other things are assumed the same as in the embodiment. In this embodiment, at the time of the upper page programming that can be in a condition that programming is processed in the non-selected Word Line WLn+1, the voltage V4 that is a predetermined voltage higher than the voltage V3 is applied. The voltage V4 is set to an optimal voltage, considering the channel potential raised by the voltage V4 and the disturbance like a weak programming by the voltage V4 at the memory cells connected to the non-selected Word Line WLn+1.

It is preferable for the voltage V4 to be V4>Vm due to concerns of erratic programming caused by the GIDL described in the EXAMPLE 1. In other words, even if there is a plus threshold voltage (Vt) state by the programming of a lower page in a memory cell connected to the non-selected Word Line WLn+1, it is set so as to suppress the local channel boosting state like the above-mentioned one in the memory cell (the selected memory cell) connected to the selected Word Line WLn. Thus it may be suppressed that the channel potential of the memory cell (the selected memory cell) connected to the above-mentioned selected Word Line WLn increases much higher than required.

An adjustment is performed accordingly, in which the voltage V3 is applied to the non-selected Word Line WLn+1 at the lower page programming and the voltage V4 is applied to the non-selected Word Line WLn+1 at the upper page programming. These adjustment promotes optimal voltage V3 and V4 at the time of the lower page programming and that of the upper page programming, respectively.

In addition, as in the EXAMPLE 1, on the occasion of the upper page programming in which higher programming voltage is required, the voltage of the non-selected cell Word Line WLn+1 adjacent to the selected Word Line WLn is set as the higher voltage V4 rather than the voltage V3 at the time of the lower page programming. Thus, programming voltage Vpgm required in the programming of the upper page may be decreased.

EMBODIMENT 3

In this embodiment, another driving method of the NAND type flash memory device according to embodiments of the non-volatile semiconductor memory device of the present invention is explained.

This embodiment is similar to the NAND type flash memory device 1 of the above-mentioned embodiment except for a driving method at the time of data programming; therefore the detail of the configuration of the NAND type flash memory device 1 will not be explained here again.

Figure 22:
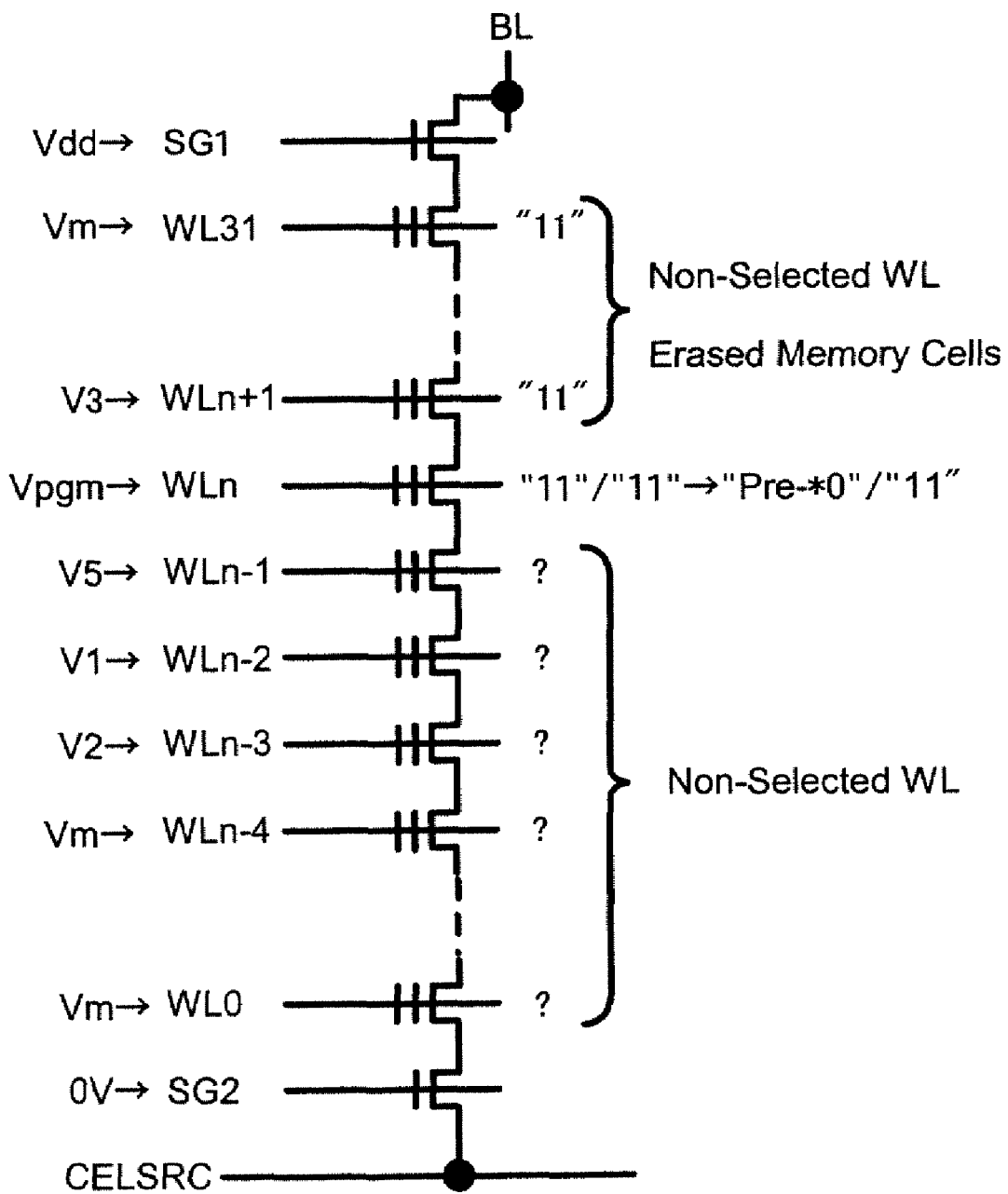
FIG. 22 is a diagram showing an example of the programming pulse applied state in lower page programming of the NAND type flash memory device 1 according to another embodiment of the non-volatile semiconductor memory device of the present invention.
Figure 23:
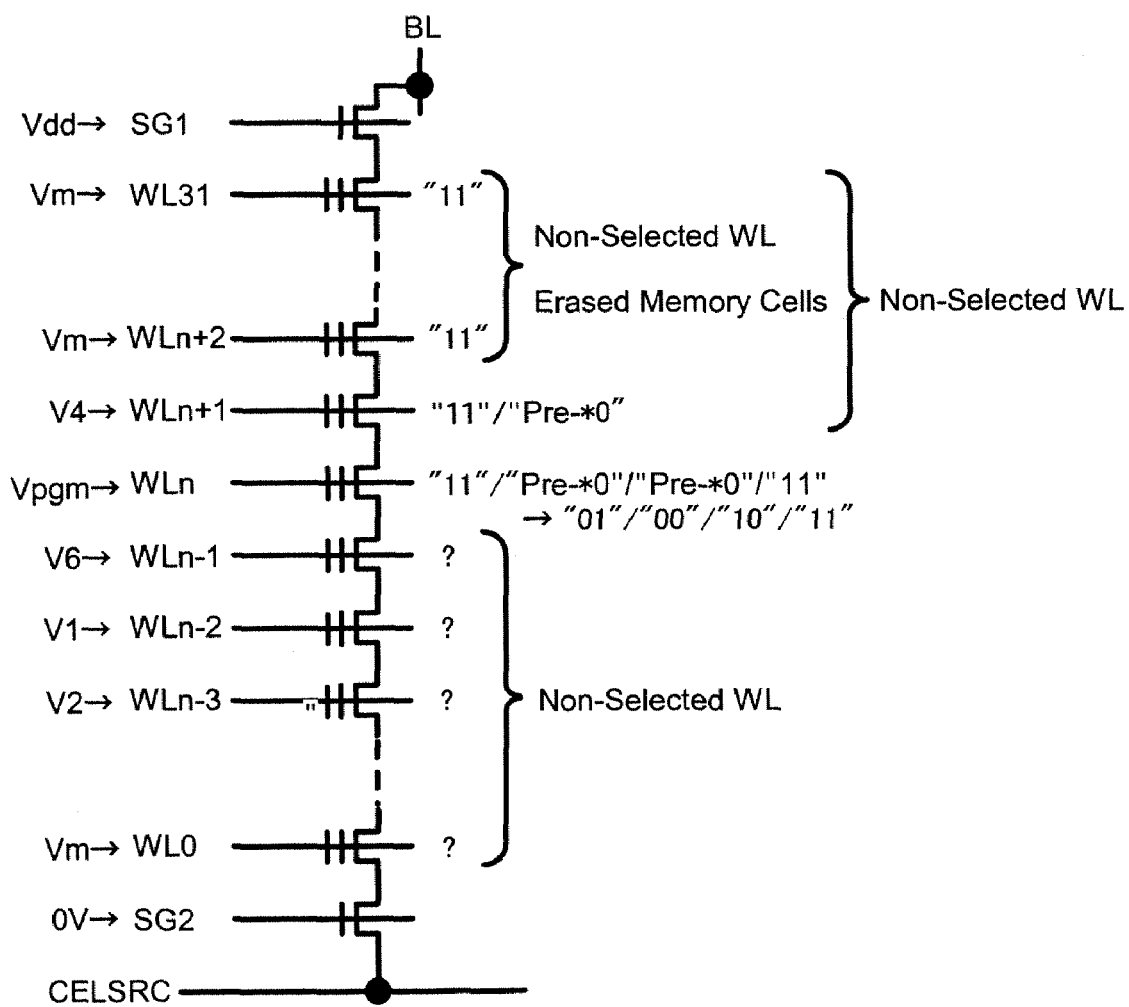
FIG. 23 is a diagram showing an example of the programming pulse applied state in the upper page programming of the NAND type flash memory device 1 according to another embodiment of the non-volatile semiconductor memory device of the present invention.

In this embodiment, a programming applied pulse state shown in FIG. 22 is set at the time of the lower page programming, and a programming pulse applied state shown in FIG. 23 is set at the time of the upper page programming. A summary of applied voltages at the time of lower page programming and an applied voltage at the time of upper page programming in this embodiment is shown in FIG. 24. In addition, timings of applying the voltages V1-V4 and stopping supply of the voltages V1-V4 are set the same as the case shown in the above-mentioned FIG. 20. Timings of applying the voltages V5 and V6 and stopping supply of the voltages V5 and V6 are set the same as the timings of applying the voltages V1-V4 and stopping supply of the voltages V1-V4. In a programming operation of the lower page, in concurrence with the voltage V3 is applied to the non-selected Word Line WLn+1, a voltage V5 is applied to the first non-selected Word Line WLn−1; the voltage V1 is applied to the second non-selected Word Line WLn−2; and the voltage V2 is applied to the fourth non-selected Word Line WLn−3 adjacent to a source line CELSRC side of the second non-selected Word Line WLn−2. In addition, in a programming operation of the upper page, in concurrence with a voltage V4 is applied to the non-selected Word Line WLn+1; a voltage V6 is applied to the first non-selected Word Line WLn−1; the voltage V1 is applied to the second non-selected Word Line WLn−2; and the voltage V2 is applied to the fourth non-selected Word Line WLn−3. Except for these the other things are set to be same as in the above embodiment. A relationship of the voltage V3 and the voltage V4 is based on the same concept as the EXAMPLE 3, i.e., V3≦Vm<V4. And a relationship of the voltage V5 and the voltage V6 is V1≦V5 <V6. In addition, the voltage V5 may be almost equal to the voltage V3, and the voltage V6 may be almost equal to the voltage V4.

As described there is the case that the programming of the lower page is being performed in the non-selected cell Word Line WLn+1 at the time of programming of the upper page; however, together with the influence may be canceled and suppressed a programming voltage Vpgm of the upper page not to increase too much by an effect of coupling with the non-selected word lines adjacent to the selected word line.

Summarizing the above description, in the multi-level memory operation of the NAND type flash memory device, a programming method of threshold voltage (Vt) as shown in FIG. 8 and a programming order as shown in FIG. 9 are effective for a speed-up of the programming. However it is desirable that it be possible to optimize the programming pulse applied operation for the lower page and the programming pulse applied operation for the upper page separately to realize this programming method with a more desirable form. In other words, in the state that data of a lower page is being programmed into a memory cell of the non-selected word line adjacent to selected word line, in the case that the data of the upper page are programmed, it is desirable that an applied voltage toward the non-selected word lines adjacent to the selected word line and the farther non-selected word lines can be changed accordingly, depending on the case of the lower page programming and on the case of the upper page programming.

The combinations of the applied voltages in the case of the programming shown in the embodiment and the examples are examples, not always limited to these. What is important is that the applied voltages of the non-selected word lines at the predetermined range from the selected word line are changed depending on either at the time of programming the lower page or at the time of programming the upper page.

By means of adjusting an applied/driving method with voltages in accordance with a characteristic of a cell, reliability of data programming can be improved, and the programming voltage can be reduced.

In the non-volatile semiconductor memory device according to one embodiment of the present invention, generation of erratic programming may be suppressed by considering the programming pulse applied operation to use in the programming method in which a coupling noise among floating gates (FG) may be inhibited as the most suitable embodiment.

EMBODIMENT 4

The non-volatile semiconductor memory device according to one embodiment of the present invention provides abovementioned outstanding effects. It may be used as a memory device in electronic devices such as computers, digital still camera, a mobile telephone, household electrical appliance, etc.

What is claimed is:

1. A non-volatile semiconductor memory device comprising:
a memory cell array having a plurality of electrically-programmable memory cells, said memory cells being multi-level cells, said memory cell array comprising,
a plurality of memory cell units, each memory cell unit including memory cells connected in series, each memory cell unit being connected to a source selection gate transistor at one end and to a drain selection gate transistor at the other end,
a plurality of word lines each connected to each of control gates of said memory cells, said plurality of word lines including a selected word line connected to a control gate of a selected memory cell to be programmed at a first time and then at a second time by applying to said selected word line a positive potential enough to turn on said selected memory cell before a next erasure operation, and a plurality of non-selected word lines except for said selected word line;
a plurality of bit lines each connected to said drain selection gate transistor of each of said plurality of said memory cell units; and
a source line commonly connected to the source side of said source selection gate transistor of each of said memory cell units,
wherein a potential applied to a non-selected word line adjacent to said selected word line at said second time of programming said selected memory cell is higher than a potential applied to said non-selected word line adjacent to said selected word line at said first time of programming said selected memory cell.

2. The non-volatile semiconductor memory device according to claim 1, wherein said non-selected word line adjacent of said selected word line is at the side to said drain selection gate transistor.

3. The non-volatile semiconductor memory device according to claim 1, wherein said non-selected word line adjacent to said selected word lines is at the side of said source selection gate transistor.

4. The non-volatile semiconductor memory device according to claim 1, wherein potentials applied to both of non-selected word lines adjacent to said selected word line at time of programming said selected memory cell at said second time are higher than said potentials applied to said both of non-selected word lines at time of programming said selected memory cell at said first time.

5. The non-volatile semiconductor memory device according to claim 1, wherein each memory cell has a single floating gate the amount of charges in which determines a threshold voltage and said selected memory cell is programmed by making its threshold voltage by injecting charges to the floating gate of said memory cell.

6. The non-volatile semiconductor memory device according to claim 5, wherein the threshold voltage after said first time is substantially positioned almost in the center between the minimum threshold voltage and the maximum threshold voltage or is substantially the same as the threshold voltage before said first time.

7. The non-volatile semiconductor memory device according to claim 1, wherein a memory cell the control gate of which is connected to said non-selected word line is programmed between said first time and said second time.

8. The non-volatile semiconductor memory device according to claim 7, wherein said non-selected word line adjacent to said selected word line is at the side of said drain selection gate transistor.

9. A non-volatile semiconductor memory device comprising:
a memory cell array having a plurality of electrically-programmable memory cells, each of said memory cells being a multi-level cell to be programmed to have a threshold voltage among three or more threshold voltage distributions, said memory cell array comprising, a plurality of memory cell units, each memory cell unit including memory cells connected in series, each memory cell unit being connected to a source selection gate transistor at one end and to a drain selection gate transistor at the other end, a plurality of word lines each connected to each of control gates of said memory cells, said plurality of word lines including a selected word line connected to a control gate of a selected memory cell to be programmed to raise the threshold voltage by applying to said selected word line a positive potential enough to turn on said selected memory cell, and a plurality of non-selected word lines except for said selected word line;

a plurality of bit lines each connected to said drain selection gate transistor of each of said plurality of said memory cell units; and a source line commonly connected to the source side of said source selection gate transistor of each of said memory cell units, wherein a potential applied to a non-selected word line adjacent to said selected word line at time of programming said selected memory cell having a threshold voltage higher than a predetermined voltage is higher than a potential applied to said non-selected word line adjacent to said selected word line at time of programming said selected memory cell having a threshold voltage lower than a predetermined voltage.

10. The non-volatile semiconductor memory device according to claim 9, wherein said predetermined voltage is positioned between the lowest threshold voltage distribution and the second lowest threshold voltage distribution.

11. The non-volatile semiconductor memory device according to claim 9, wherein said predetermined voltage is positioned between the highest threshold voltage distribution and the second highest threshold voltage distribution.

12. The non-volatile semiconductor memory device according to claim 9, wherein said non-selected word line adjacent to said selected word line is at the side of said drain selection gate transistor.

13. The non-volatile semiconductor memory device according to claim 9, wherein said non-selected word line adjacent to said selected word line is at the side of said source selection gate transistor.

14. The non-volatile semiconductor memory device according to claim 9, wherein potentials applied to both of non-selected word lines adjacent to said selected word line at time of programming said selected memory cell having a threshold voltage higher than said predetermined voltage are higher than said potentials applied to said both of non-selected word lines at time of programming said selected memory cell having a threshold voltage lower than said predetermined voltage.

15. The non-volatile semiconductor memory device according to claim 9, wherein a memory cell the control gate of which is connected to said non-selected word line is programmed to have a threshold voltage higher than said predetermined voltage before said selected memory cell is programmed.

16. The non-volatile semiconductor memory device according to claim 15, wherein said non-selected word line adjacent to said selected word line is at the side of said drain selection gate transistor.

17. A non-volatile semiconductor memory device comprising:

a memory cell array having a plurality of electrically-programmable memory cells, each of said memory cells being a multi-level cell having a single floating gate, the threshold voltage of said memory cell increasing according to the amount of charges in said single floating gate, said threshold voltage corresponding to a combination of a lower page bit and a upper page bit, said memory cell array comprising, a plurality of memory cell units, each memory cell unit including memory cells connected in series, each memory cell unit being connected to a source selection gate transistor at one end and to a drain selection gate transistor at the other end, a plurality of word lines each connected to each of control gates of said memory cells, said plurality of word lines including a selected word line connected to a control gate of a selected memory cell to be programmed by applying to said selected word line positive potentials enough to turn on said selected memory cell, and a plurality of non-selected word lines except for said selected word line;

a plurality of bit lines each connected to said drain selection gate transistor of each of said plurality of said memory cell units; and a source line commonly connected to said source selection gate transistor of each of said memory cell units, wherein a potential applied to a non-selected word line adjacent to said selected word line at time of programming said upper page bit of said selected memory cell are higher than potentials applied to said non-selected word line adjacent to said selected word line at time of programming said lower page bit of said selected memory cell.

18. The non-volatile semiconductor memory device according to claim 17, wherein said non-selected word line adjacent to said selected word line is at the side of said drain selection gate transistor.

19. The non-volatile semiconductor memory device according to claim 17, wherein potentials applied to both of non-selected word lines adjacent to said selected word line at time of programming said upper page bit of said selected memory cell are higher than said potentials applied to said both of non-selected word lines at time of programming said lower page bit of said selected memory cell.

20. The non-volatile semiconductor memory device according to claim 17, wherein a lower page bit of a memory cell the control gate of which is connected to said non-selected word line is programmed before programming said lower page bit of said selected memory cell.

* * * * *